United States Patent
Evans et al.

(10) Patent No.: US 12,074,235 B2
(45) Date of Patent: Aug. 27, 2024

(54) SEEDED SOLID-PHASE CRYSTALLIZATION OF TRANSPARENT CONDUCTING VANADATE PEROVSKITES

(71) Applicant: Wisconsin Alumni Research Foundation, Madison, WI (US)

(72) Inventors: Paul Gregory Evans, Madison, WI (US); Thomas Francis Kuech, Madison, WI (US); Donald E. Savage, Madison, WI (US); Yajin Chen, Madison, WI (US); Samuel Marks, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 1023 days.

(21) Appl. No.: 17/015,428

(22) Filed: Sep. 9, 2020

(65) Prior Publication Data

US 2021/0069999 A1  Mar. 11, 2021

Related U.S. Application Data

(60) Provisional application No. 62/898,692, filed on Sep. 11, 2019.

(51) Int. Cl.
*B32B 9/00* (2006.01)
*C01G 31/02* (2006.01)
(Continued)

(52) U.S. Cl.
CPC .......... *H01L 31/0232* (2013.01); *C01G 31/02* (2013.01); *C23C 14/088* (2013.01);
(Continued)

(58) Field of Classification Search
CPC ..... H01L 31/0232; B82Y 30/00; B82Y 40/00; C30B 29/30; C30B 28/02
(Continued)

(56) References Cited

U.S. PATENT DOCUMENTS

2010/0001619 A1  1/2010  Yuuya et al.
2010/0001620 A1  1/2010  Yuuya

FOREIGN PATENT DOCUMENTS

CN           103429799 B  *  4/2016

OTHER PUBLICATIONS

Chen et al., "Seeded Lateral Solid-Phase Crystallization of the Perovskite Oxide SrTiOs" J. Phys. Chem C. 2019, 123, 7447-7456.
(Continued)

*Primary Examiner* — Daniel H Miller
(74) *Attorney, Agent, or Firm* — Bell & Manning, LLC

(57) ABSTRACT

Transparent, electrically conductive vanadium oxide-based perovskite films and methods of making the vanadium oxide-based perovskite films are provided. Transparent conducting vanadate perovskites are made by forming a layer of amorphous vanadate perovskite precursor around a plurality of nanoscale, crystalline, perovskite oxide seeds and heating the layer of amorphous vanadate perovskite precursor at a temperature that favors lateral vanadate perovskite crystal growth from the perovskite oxide seeds over homogeneous crystal nucleation within the layer of amorphous vanadate perovskite precursor material. The crystallization processes can form the desired vanadate perovskite phase directly or via a transformation in a controlled gas environment from an initial crystallized vanadate perovskite phase that has a higher oxidation state.

13 Claims, 19 Drawing Sheets

(51) Int. Cl.
| | |
|---|---|
| C23C 14/08 | (2006.01) |
| C23C 14/35 | (2006.01) |
| C23C 14/58 | (2006.01) |
| C30B 28/02 | (2006.01) |
| H01L 31/0232 | (2014.01) |
| H01L 31/08 | (2006.01) |
| B82Y 30/00 | (2011.01) |
| B82Y 40/00 | (2011.01) |
| C30B 29/30 | (2006.01) |

(52) U.S. Cl.
CPC .......... *C23C 14/35* (2013.01); *C23C 14/5806* (2013.01); *C30B 28/02* (2013.01); *H01L 31/085* (2013.01); *B82Y 30/00* (2013.01); *B82Y 40/00* (2013.01); *C01P 2002/34* (2013.01); *C30B 29/30* (2013.01)

(58) Field of Classification Search
USPC ....................................................... 428/408
See application file for complete search history.

(56) References Cited

OTHER PUBLICATIONS

Roy G. Gordon, "Criteria for Choosing Transparent Conductors," downloaded from https://www.cambridge.org/core, MRS Bulletin/Aug. 2000.

Zhang et al., "Correlated metals as transparent conductors," Nature Materials, vol. 15, Feb. 2016.

Boileau et al., "Tuning of the Optical Properties of the Transparent Conducting OxideSrVO$_3$,"*Adv. Optical Mater.* 2019, 1801516.

Waduge et al., "Solid Phase Epitaxy of PrAlO$_3$ Films Grown by Atomic Layer Deposition," CS Appl. Nano Mater. 2019, 2, 11, 7449-7458, Publication Date :Nov. 5, 2019 https://doi.org/10.1021/acsanm.9b02153.

Paskiewicz et al., "Single-Crystalline SrRuO$_3$ Nanomembranes: A Platform for Flexible Oxide Electronics," Nano Lett. 2016, 16, 1, 534-542, Publication Date:Dec. 11, 2015, https://doi.org/10.1021/acs.nanolett.5b04176.

Evans et al., "Crystallization of amorphous complex oxides: New geometries and new compositions via solid phase epitaxy," Current Opinion in Solid State & Materials Science 22 (2018) 229-242.

Maret et al., "Seeded Solid-Phase Epitaxy of Atomic Layer Deposited Aluminum Oxide," Cryst. Growth Des. 2016, 16, 3, 1662-1666 Publication Date: Jan. 27, 2016 https://doi.org/10.1021/acs.cgd.5b01744.

Simpson et al., "Kinetics of the Amorphous -> $\gamma$ -> $\alpha$ Transformations in Aluminum Oxide: Effect of Crystallographic Orientation," *J. Am. Ceram. Soc.* 81 (1) 61-66 (1998).

Taira et al., "Lateral Solid-Phase Epitaxy of Oxide Thin Films on Glass Substrate Seeded withy Oxide Nanosheets," ACS NANO, vol. 8, No. 6, pp. 6145-6150, 2014.

Taira et al., "Lateral Solid-Phase Epitaxy of Oxide Thin Films on Glass Substrate Seeded withy Oxide Nanosheets," Supporting Information, ACS NANO, vol. 8, No. 6 2014.

Rankin et al., "Annealing-environment effects in the epitaxial regrowth of ion-beam-layers on CaTiO$_3$," Journal of Applied Physics 78, 1519 (1995).

Lee et al., "Self-limiting behavior of the grain growth in lead zirconate titanate thin films," Journal of Applied Physics, vol. 92, No. 5, Sep. 1, 2002, 5 pages.

Chen et al., "Distinct Nucleation and Growth Kinetics of Amorphous SrTiO$_3$ on (001) SrTiO$_3$ and SiO$_2$/Si: A step toward new architectures," *ACS Appl. Mater. Interfaces* 2017, 9 41034-41042.

Riza et al., "Prospects and challenges of perovskite type transparent conductive oxides in photovoltaic applications. Part I—Material developments," *Solar Energy* 137 (2016) 371-378.

Brahlek et al., "Opportunities in vanadium-based strongly correlated electron systems," *MRS Communicatinos* 2017, 7, 27-52.

\* cited by examiner

FIG. 9A-oriented STO seed crystal
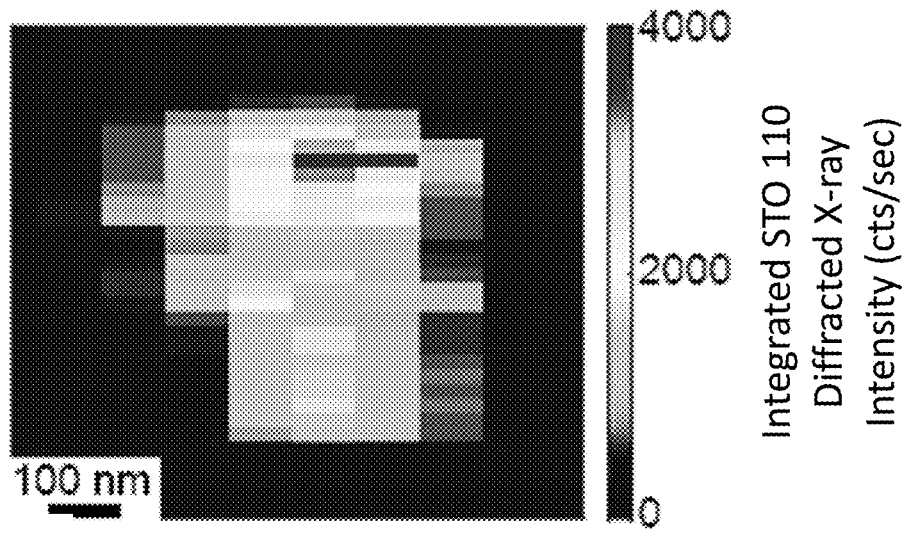
FIG. 9B-oriented STO seed crystal
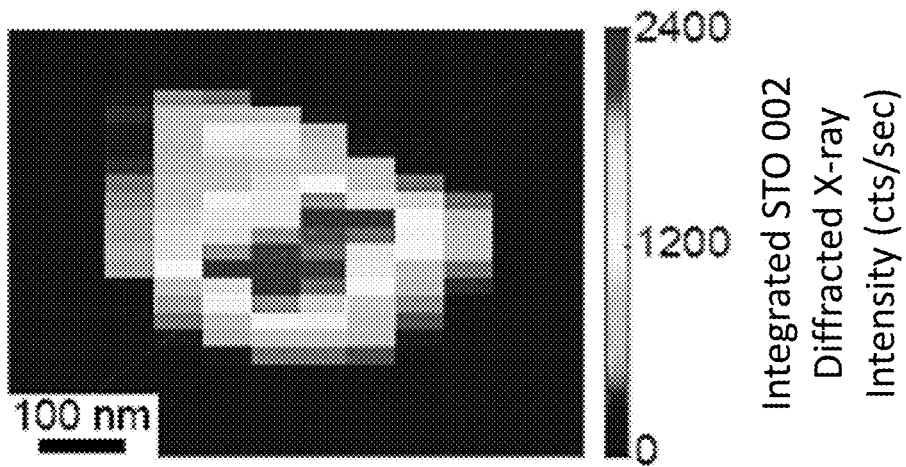
FIG. 9C
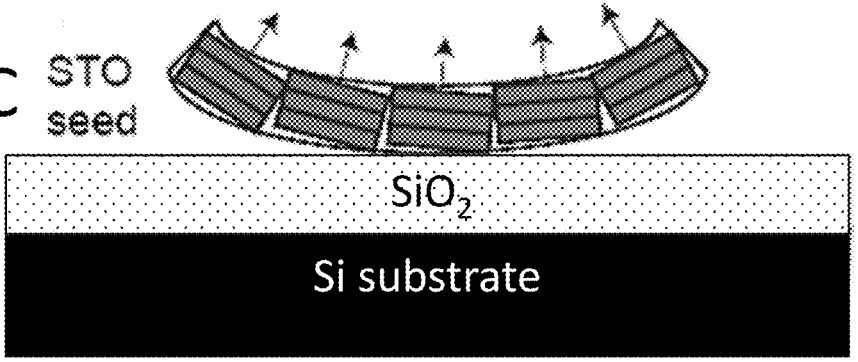

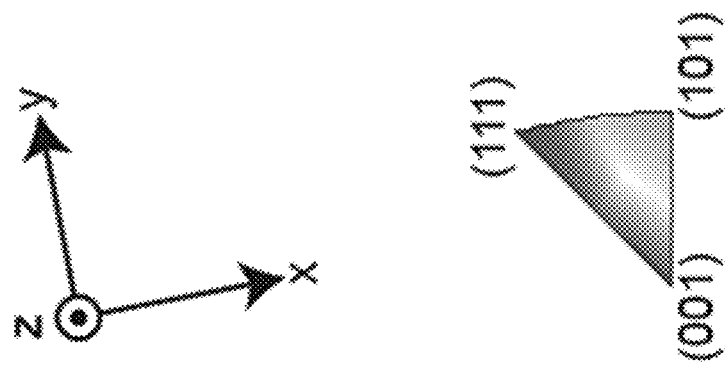
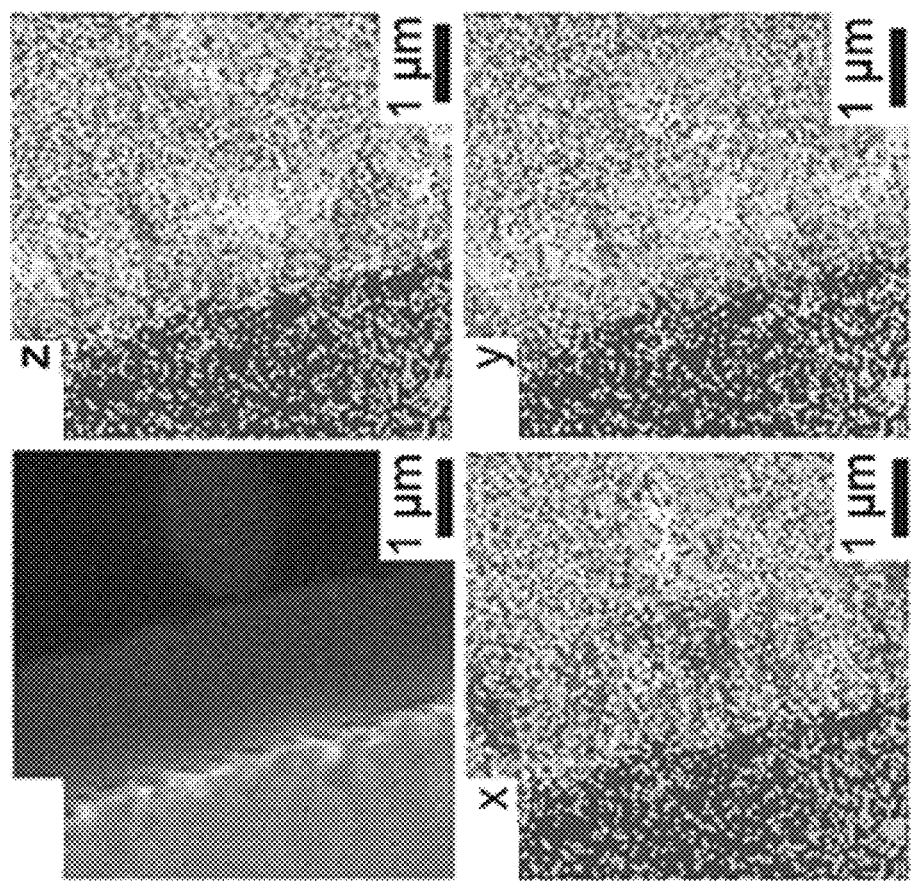
FIG. 11A  FIG. 11B  FIG. 11C  FIG. 11D

SEEDED SOLID-PHASE CRYSTALLIZATION OF TRANSPARENT CONDUCTING VANADATE PEROVSKITES

CROSS-REFERENCE TO RELATED APPLICATIONS

The present application claims priority to U.S. provisional patent application No. 62/898,692 that was filed Sep. 11, 2019, the entire contents of which are incorporated herein by reference.

REFERENCE TO GOVERNMENT RIGHTS

This invention was made with government support under DMR-1720415 awarded by the National Science Foundation. The government has certain rights in the invention.

BACKGROUND

Transparent conductors underpin a wide range of technologies requiring separate control of electronic and optical properties. Key examples include the conductive layer of liquid crystal displays, infrared-blocking layers of architectural and industrial glass in windows and other applications, and contacts to photovoltaic devices. Among transparent conductors, transparent conducting oxides (TCOs) are a key class of materials because the properties of oxide materials can be varied over a wide range by adjusting their compositions.

The performance of transparent conductors is described by figures of merit that depend on the optical transmittance and the electrical sheet resistance. The sheet resistance in particular depends strongly on the crystallinity, microstructure, and fundamental electronic properties of the oxide compound. Decreasing the sheet resistance presents a significant obstacle in discovering and implementing TCOs because optimizing all of these properties for the most important compounds has been challenging. The processing conditions of complex oxides with the most favorable compositions are particularly important in this respect.

$SrVO_3$ (SVO) and $CaVO_3$ are correlated-electron oxide materials that exhibit metallic conduction. These vanadates are representative of a new class of transparent conducting perovskite oxides that have found uses in flat-panel display and photovoltaic technologies. The correlated-electron vanadates and other complex-oxide compounds with similar structural and chemical properties have been synthesized using thin film growth techniques such as sputtering, pulsed laser deposition (PLD), molecular beam epitaxy, and chemical vapor deposition, all of which proceed by the continuous growth of epitaxial layers on planar two-dimensional (2D) crystal surfaces. Epitaxial thin film growth by any of these techniques involves long surface diffusion lengths and often requires the line-of-sight transport of material from the sources to the growth surface. Moreover, epitaxial growth from a substrate is limited by the size of the available single-crystal growth substrates, which are often on the scale of one to a few centimeters rather than the larger-scales dimensions of meters or more that would be commercially relevant. The lack of a synthesis method that can produce high-figure-of-merit films of these highly functional TCOs over large areas has hindered their commercial development.

SUMMARY

Methods for forming electrically conductive vanadium oxide-based perovskite films are provided.

One embodiment of a method of forming an electrically conductive vanadium oxide-based perovskite film includes the steps of forming the plurality of nanoscale crystalline perovskite oxide seeds on a substrate; depositing a layer of amorphous vanadate perovskite precursor over the nanoscale crystalline seeds; and heating the layer of amorphous vanadate perovskite precursor, whereby the layer of amorphous vanadate perovskite precursor is laterally crystallized from the nanoscale crystalline perovskite oxide seeds to form a polycrystalline vanadate perovskite film. Polycrystalline films that can be formed using the methods layers with compositions corresponding to SVO, $CaVO_3$, $La_xSr_{1-x}VO_3$ films where x is in the range from 0 to 0.5, and mixtures of two or more of these compounds. The films are crystallized at temperatures at which kinetics favor lateral vanadate perovskite crystal growth from the perovskite oxide seeds over homogeneous vanadate crystal nucleation within a layer of amorphous perovskite oxide precursor.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIGS. 9A and 9B depict synchrotron nanobeam XRD maps of isolated STO seed crystals and the crystallized STO film on top of the seeds with (FIG. 9A) [110] and (FIG. 9B) [001] crystallographic directions along the surface normal using the 110 and 002 X-ray reflections, respectively. FIG. 9C depicts a diagram of STO nanocrystal seed curvature. The lines and arrows for each crystallite indicate the orientation of the crystallographic planes within the crystals and the vector direction normal to the crystallographic planes.

FIG. 11A depicts a secondary electron SEM image after crystallization from an SRO NM seed at 450° C. for 2160 min. FIGS. 11B-11D depict electron backscatter diffraction (EBSD) inverse pole figure maps of the area shown in FIG. 11A in which each pixel is shaded according to which crystallographic direction of the combined SRO and STO crystal is along the z, x, and y unit vectors defined in the inset.

DETAILED DESCRIPTION

Figure 1:
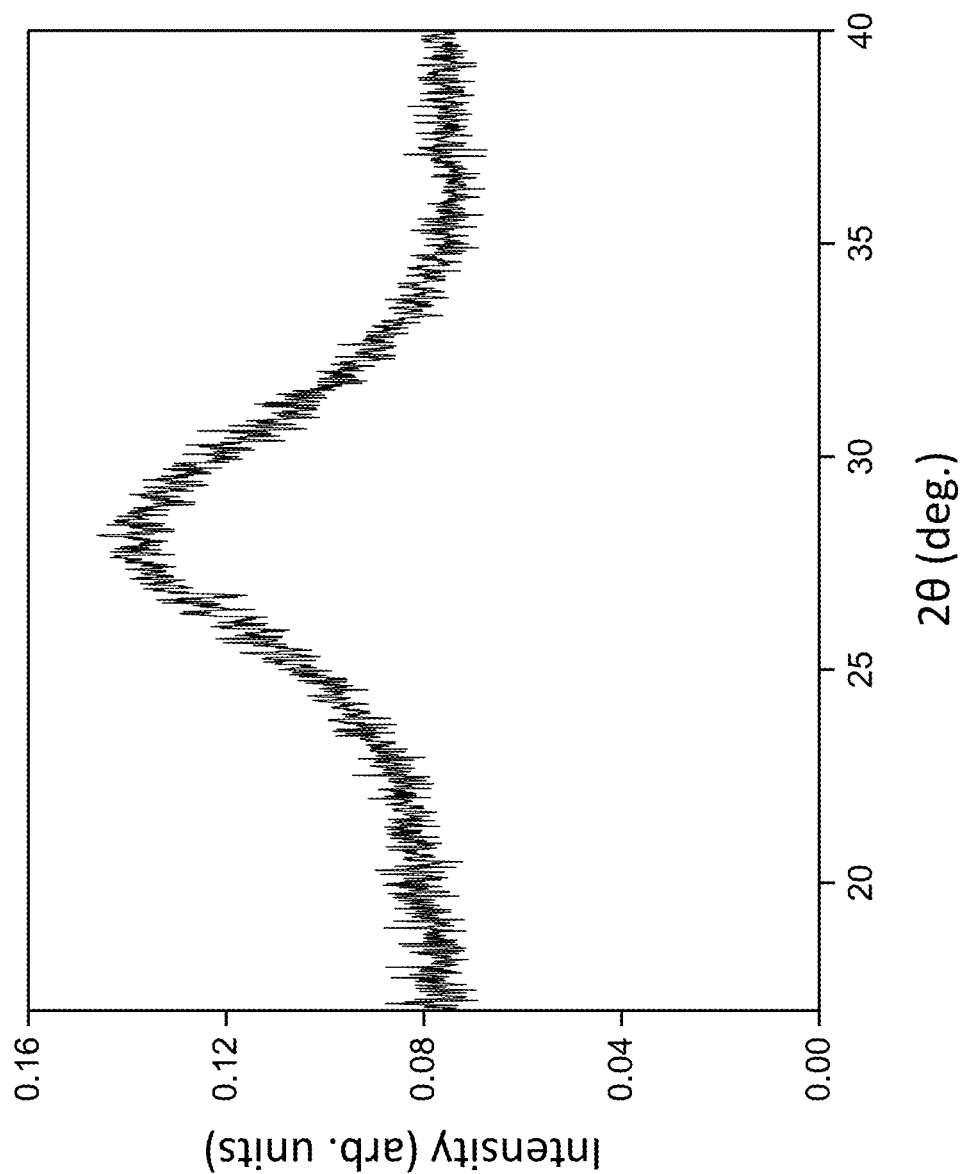
FIG. 1. X-ray scattering pattern of an as-deposited layer formed by sputtering from the SVO target onto an $SiO_2$/Si substrate.

One aspect of the invention provides transparent, electrically conductive vanadium oxide-based perovskite films. Methods that can be used to make the vanadium oxide-based perovskite films, as well as other transparent, electrically conductive perovskite oxide films are also provided.

Perovskite oxides are materials having the general formula $ABO_3$, where A and B represent cations, and the A cations are larger than the B cations. Vanadium oxide-based perovskite oxides are vanadates having the perovskite structure $AVO_3$, where A represents one or more metal cations. Vanadate perovskites can be doped, such that they include two different large metal cations, in addition to the vanadium. For doped perovskite oxides, the "A" in the perovskite formula represents two or more metal cations.

Transparent conductive vanadate perovskites are characterized by high electrical conductivities and high optical transparencies in at least a portion of the visible spectrum. The transparent conductive vanadate perovskites include the correlated-electron electronically conductive materials SVO and $CaVO_3$, Sr-doped $LaVO_3$, which can be represented by the formula $La_xSr_{1-x}VO_3$, where x is in the range from 0 to 0.5, as well as mixtures of these compounds.

The transparent conducting vanadate perovskites can be made by forming a layer of amorphous vanadate perovskite precursor around a plurality of nanoscale, crystalline, perovskite oxide seeds, and subsequently heating the layer of amorphous vanadate perovskite precursor. When the heating step is conducted at a sufficiently low temperature, the film growth kinetics will favor lateral perovskite oxide crystal growth from the perovskite oxide seeds over competing unfavorable processes including (i) homogeneous perovskite oxide crystal nucleation within the layer of amorphous perovskite oxide precursor, (ii) high-temperature reactions with other layers of the thin film, and (iii) decomposition into gas-phase components. As a result, the layer of amorphous perovskite oxide precursor can be converted into a polycrystalline perovskite oxide film composed of large crystalline perovskite oxide grains.

The crystallization processes can form the desired vanadate perovskite phase directly or via a transformation in a controlled gas environment from an initial crystallized vanadate perovskite phase that has a different oxidation state. For example, when the vanadate perovskite film is crystallized in a gas atmosphere having an oxygen activity that results in an as-crystallized vanadate perovskite film comprising vanadium ions in a higher oxidation state than desired, the vanadate perovskite film can be transformed into a vanadate perovskite film having a lower oxidation state. This could occur, for example, when the initial crystallization is carried out in an oxygen-containing environment, such as ambient air. The subsequent transformation into a vanadate perovskite having a lower vanadium oxidation state can be accomplished, for example, using a post-crystallization heat treatment at a temperature of 500° C. or higher (e.g., a temperature in the range from 500° C. to 800° C.) in a gas environment having an oxygen activity that promotes the reduction of the vanadium to a desired final vanadium oxidation state (a "non-oxidizing environment"). Alternatively, the vanadate perovskite film can be crystallized in a gas environment that results in the as-crystallized vanadate perovskite having the desired vanadium oxidation state from the outset (a "non-oxidizing environment"), without the need for a subsequent reduction step. Examples of gases that can be used to form non-oxidizing environments include Hz, inert gases, such as argon (Ar), mixtures thereof, and other gas mixtures setting oxygen partial pressures sufficiently low to reduce the oxidation state of vanadium ions.

The perovskite oxide of the nanoscale crystalline seeds can have the same chemical composition and structural phase as the vanadate perovskite of the crystals that are formed from the seeds or it can be a different perovskite chemical composition or structural phase oxide, provided that it contains structural subunits within the crystal structure that are sufficiently similar to the crystalline phases of the vanadate perovskite to be formed. For example, suitable crystalline seed materials for the growth of the transparent conducting vanadate perovskites include STO, $LaAlO_3$ (LAO), and $(La_{0.3}Sr_{0.7})(Al_{0.65}Ta_{0.35})O_3$ (LSAT), and multiple structural phases of $Al_2O_3$.

As used herein, the term nanoscale crystalline seed refers to a crystalline structure having a least one dimension that is smaller than 1 µm and, more typically, smaller than 100 nm. For example, the thickness of the seed may be less than 1 µm, while the lateral dimensions of the seed are equal to or greater than 1 µm. Seeds such as these are referred to as NM seeds and may have lateral dimensions on the order of, for example, several (e.g., ≥3) µm to 1 mm. Other embodiments of the seeds have a thickness and one lateral dimension (e.g., width) of less than 1 µm, while the other lateral dimension (e.g., length) is equal to or greater than 1 µm. These narrow, higher aspect ratio seeds are referred to as nanoribbon seeds and may have length dimensions on the order of, for example, several (e.g., ≥3) µm to 1 mm. The term nanosheet seeds is used herein to refer to both NM seeds and nanoribbon seeds. Alternatively, both the thickness and lateral dimensions of the crystalline seeds may be less than 1 µm. Seeds such as these are referred to as nanocrystal seeds. By way of illustration, some embodiments of the NM seeds have a thickness of 100 nm or smaller and lateral dimensions of at least 1 µm; some embodiments of the nanoribbon seeds have a thickness of 100 nm, a width of 500 nm or smaller, and a length of at least 1 µm; and some embodiments of the nanocrystal seeds have a thickness of 100 nm or smaller and lateral dimensions of 100 nm or smaller, and thickness dimensions of 10 nm or smaller and lateral dimensions of approximately 10 nm. Depending upon how the nanoscale crystalline seeds are formed, they may be single-crystalline or polycrystalline.

Because the crystalline vanadate perovskite films do not rely upon vapor- or liquid-phase epitaxy, they can be formed on a wide variety of substrates and are not limited to substrates that form interfaces with a set relationship between the crystallographic directions of the substrate and film, termed an epitaxial relationship. As a result of the ability to allow films to be formed on substrates that do not exhibit an epitaxial relationship, a wide range of substrates can be used, including polycrystalline and amorphous substrates. Examples of suitable substrate materials include Sift, silica glasses with a wide range of compositions such as those with low melting points employed in optical and architectural applications, and organic polymers (i.e., plastic substrates).

Two approaches can be used to crystallize the vanadate perovskites, as well as other transparent conductive perovskite oxides, on a substrate. In a first approach, the nanoscale crystalline seeds are formed on or transferred to the surface of the substrate and a layer of the amorphous perovskite oxide precursor (the amorphous form of the vanadate perovskite oxide with composition leading to crystals of the crystalline structure but lacking long-range structural order) is deposited over the crystalline seeds. Alternatively, the layer of amorphous perovskite oxide precursor can be formed on the surface of the substrate, and the crystalline seeds then can be embedded in the layer of amorphous perovskite oxide precursor.

The crystalline seeds can be transferred onto a substrate by lithographically patterning the seeds in a crystalline film of an epitaxially-grown perovskite oxide, releasing the seeds from their epitaxial growth substrate using, for example, a selective etch, and transferring the released seeds to the surface of the substrate using wet or dry transfer techniques. Alternatively, the patterning of the seeds could take place after the crystalline film is released from its epitaxial growth substrate. This type of seed-transfer method is illustrated in the examples. An advantage of the seed-transfer approach is that it offers the ability to control the positions, spacing, and crystal orientation of the seeds on a substrate, making it possible to arrange the seeds in a regular pattern. However, pre-fabricated crystalline seeds made using methods other than epitaxial growth and lithography and/or other than transfer printing techniques can also be used. For example, pre-fabricated crystalline seeds in a liquid solution can be drop cast or spin coated onto the substrate surface.

Alternatively, the crystalline seeds can be formed directly on the surface of the substrate. For example, using the methods illustrated in Example 2, polycrystalline seeds can be formed on a substrate by heating a thin amorphous film of a perovskite oxide, whereby the amorphous layer is converted into seeds via ripening and crystallization.

In embodiments in which the layer of amorphous perovskite oxide precursor is formed on the surface of the substrate and the crystalline seeds are then embedded in the layer of amorphous perovskite oxide precursor, the crystalline seeds may be disposed opposite and facing the substrate and surrounded laterally by the layer of amorphous oxide precursor.

In some embodiments of this approach, a plurality (i.e., two or more) of the crystalline seeds can be formed on a surface of a support, and this seed array can then be either embedded in or placed in contact with the upper surface of a pre-fabricated layer of amorphous perovskite oxide precursor. By way of illustration, the crystalline seeds can be fabricated with beveled edges (e.g., points) at their distal ends, such that the crystalline seeds can be placed in mechanical contact with the layer of amorphous perovskite oxide precursor layer by pressing the seeds into the surface. Any portions of the embedded crystalline seeds extending above the layer of amorphous perovskite oxide precursor, as well as the support, can be cleaved from the structure prior to or subsequent to heating the layer of amorphous perovskite oxide precursor to convert it into a crystalline perovskite oxide film. The use of a regular array of seeds provides for the control of seed crystal position, spacing, and crystal orientation. However, the seed array need not be a regular array.

The amorphous perovskite oxide precursor can be deposited using a variety of techniques, including sputtering, atomic layer deposition, and PLD. The amorphous oxide layer can alternatively be formed by the use of a high-energy ion beam (termed ion implantation) directed onto the surface of a crystallized layer, inducing a transition to the amorphous form. As used herein, the term "amorphous perovskite oxide precursor" refers to the amorphous form of the perovskite oxide, which is converted into its crystalline form via the heat treatment methods described herein. Thus, an amorphous vanadate perovskite precursor refers to the amorphous form of the crystalline vanadate perovskite of the final film. The thickness of the layer of amorphous perovskite oxide precursor can be less than, equal to, or greater than that of the crystalline seeds, and it will typically be formed uniformly over the substrate and the crystalline seeds. By way of illustration only, layer thicknesses of 5 nm to 100 nm can be used.

Once the amorphous perovskite oxide precursor is formed around the crystalline perovskite seeds, the amorphous perovskite oxide precursor is heated to induce it to crystallize from the seeds. This crystallization proceeds outwardly from the seeds at an expanding crystal/amorphous growth front. Provided that the temperature is sufficiently low, the kinetics of crystallization will favor lateral crystal growth initiated at the crystalline seeds rather than homogeneous nucleation within the amorphous layer at locations away from the seeds. As a result, lateral crystal growth from the seeds can continue over lengths of 1 μm or greater before the growing crystals impinge on crystals grown from neighboring seeds or crystals grown via homogeneous nucleation at locations away from the seeds. For example, the growing crystals can have a lateral growth distance from the seeds of at least 1 μm, at least 2 μm, or at least 3 μm, where the term "lateral growth distance" refers to the lateral dimension measured from the seed edge to the crystal growth front (for example, from the seed edge to the crystalline/amorphous boundary). Crystal growth may continue until the growing crystals have merged into a continuous polycrystalline film or may be discontinued earlier to provide a film comprising isolated crystal grains surrounded by an amorphous perovskite oxide matrix.

If the seeds are made of the perovskite oxide with the same chemical composition as the final film, those seeds may be chemically indistinguishable from the crystallized layer. Structural differences, such as the formation of a crystallographic grain boundary or other morphological feature, however, may indicate the presence of the seed. Even in perovskite oxide films for which the seed and the final film are composed of the same perovskite oxide, the seed crystals will thus typically remain distinguishable in SEM and/or transmission electron microscopy images of the final film. Perovskite oxide films formed with seeds of different perovskite oxides will indicate the presence of the embedded seeds through the presence of compositionally distinct features. For polycrystalline films with isotropic growth rates, the growing film will typically assume a circular shape centered at the seed crystal. In other cases, the crystallized part of the larger can have crystallographically faceted shapes.

The temperature at which the lateral growth from a crystalline seed is favored over homogenous nucleation originating at a location away from the seed may vary somewhat depending upon the perovskite oxide. However, the temperature will typically be lower than 500° C. and, more typically, lower than 470° C. Even at these low temperatures, reasonable growth rates can be achieved; for example, growth rates of at least 0.5 nm/min, at least 0.7 nm/min, or at least 1 nm/min can be achieved.

EXAMPLES

Example 1: SrVO$_3$ Films

Thin crystalline layers of SrVO$_3$ can be formed by depositing thin films in the amorphous form and crystallizing these films by subsequently heating the substrate and film together. This example illustrates one method for creating amorphous layers of SVO and crystallizing those layers.

The crystallization of layers containing strontium and vanadium in the presence of oxygen has the potential to lead to other compounds besides the desired SVO, including strontium vanadate compounds with non-1:1 ratios of the Sr and V components, compounds formed via a chemical reaction with the substrate, or compounds with a 1:1 Sr:V ratio in which the oxidation state of the V ion is not 4$^+$. Crystallization conditions can be selected to avoid the formation of undesired compounds such as those formed by the reaction of the component layers with the substrate. Such crystallization conditions include the selective use of crystallization temperatures low enough to avoid atomic diffusion by more than several nm. Low crystallization temperatures are enabled by the use of a crystallographic template, which, for purposes of illustration, takes the form of a single-crystal substrate in this Example. However, the substrate can be replaced by the use of nanoscale seeds described in Example 2.

Amorphous thin films were deposited from a SVO target using on-axis radio-frequency magnetron sputtering onto room-temperature substrates. The sputter-deposition vacuum chamber was evacuated to a base pressure of 9×10$^{-7}$ Torr before the sputtering gas was introduced. The amorphous films were prepared by sputtering in an Ar:O$_2$ 9:1 atmosphere with a total gas pressure of 18 mTorr.

The amorphous layers deposited from the SVO target were separately formed on Si substrates with a native silicon oxide layer, termed SiO$_2$/Si, and on single-crystal 001-oriented STO substrates.

Grazing-incidence XRD measurements were conducted using a Bruker D8 Advance diffractometer. This diffractometer employed Cu Kα radiation with wavelength λ=1.54 Å and was operated at a voltage of 50 kV and current of 1 mA. The scattered X-ray intensity was captured using a 2D X-ray detector. A grazing incident angle of approximately 1.5° was selected in order to increase the intensity of the amorphous peak signal by maximizing the X-ray footprint on the sample surface. The 2θ angle at the center of the two-dimensional x-ray detector was set at 30°.

The crystallization process was carried out by inserting samples into a pre-heated furnace and holding at the crystallization temperature for a set period of time. Annealing and crystallization experiments were conducted in a controlled-composition gas environment that was composed of either air or gas mixtures selected to control the oxidation state of metal ions.

The x-ray scattering pattern of the as-deposited layer formed by sputtering from the SVO target onto an SiO$_2$/Si substrate is shown in FIG. 1. The broad maximum at two-theta (2θ) angle of 28 deg. arises from the thin film and indicates that the deposited layer has an amorphous structure.

Figure 2:
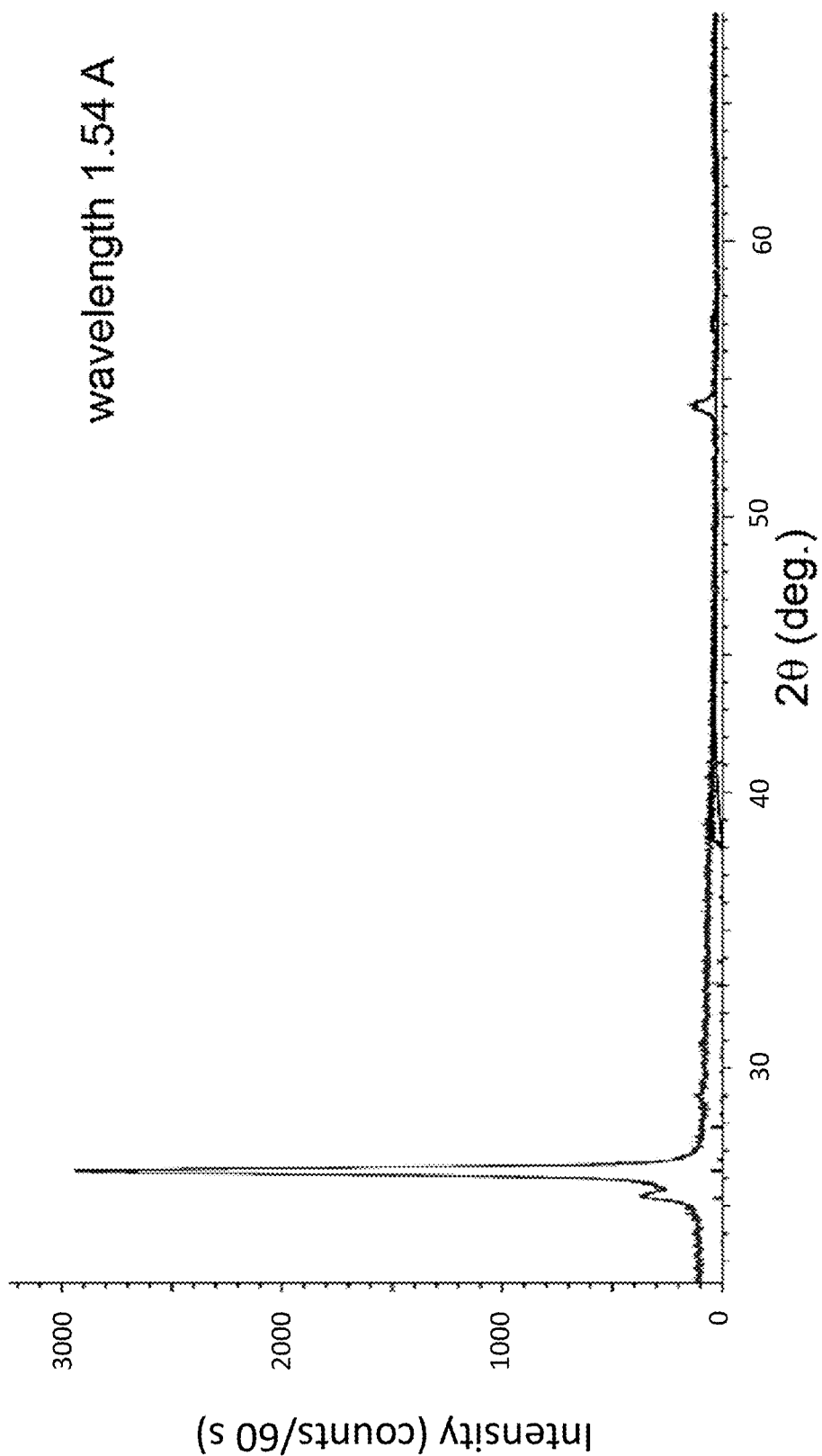
FIG. 2. X-ray diffraction (XRD) pattern of an amorphous layer deposited from the SVO target onto $SiO_2$/Si and heated to 650° C. for 3 h.

Samples created by depositing amorphous layers on SiO$_2$/Si and then heating them to 650° C. for 3 h exhibit a series of X-ray reflections that indicate that a crystallization has partially or completely occurred. An XRD pattern acquired from a sample resulting from the deposition of an amorphous layer on SiO$_2$/Si followed by heating to 650° C. for 3 h is shown in FIG. 2. The composition and structure of the crystals formed within the thin film during heating can be identified by comparing the angles at which crystalline reflections appear with tabulated values. The X-ray reflections in FIG. 2 can in principle arise from a series of compounds containing Sr, V, and O formed from the amorphous layer or from a reaction between the amorphous layer and the SiO$_2$/Si substrate at 650° C. The key features of FIG. 2 are the high degree of crystallinity and the lack of overall texture and phase selection in the crystallized layer.

Figure 3:
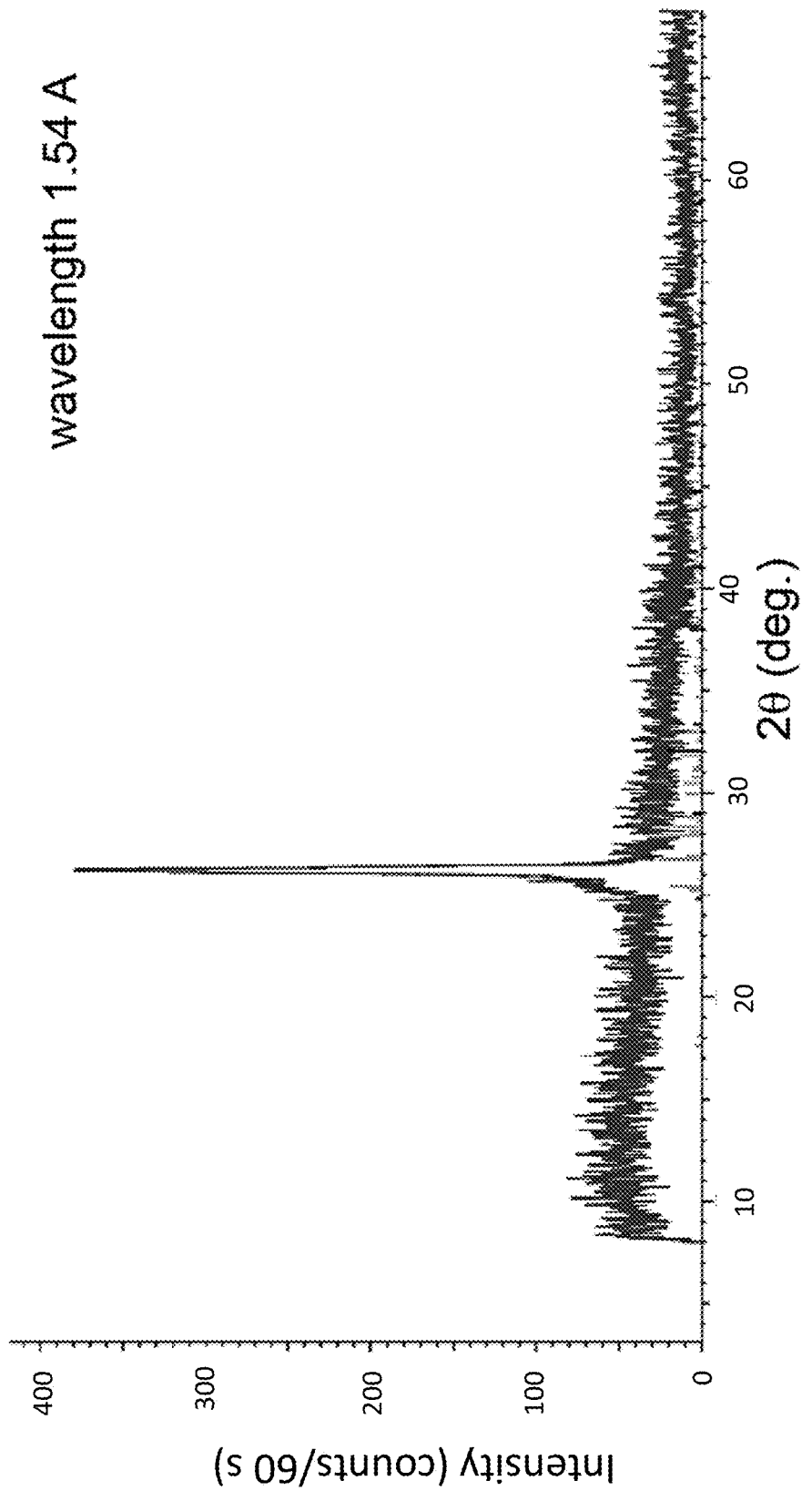
FIG. 3. XRD pattern for a sample prepared by depositing an amorphous layer from the SVO substrate onto an $SiO_2$/Si substrate and heating to 450° C. for a 24-hour period.

In comparison, a sample prepared by depositing the amorphous layer on an SiO$_2$/Si substrate and heating to 450° C. for a relatively long 24 h period produces the XRD pattern exhibiting low-intensity X-ray reflections shown in FIG. 3. In the absence of seeding, the duration and temperature of this heating process are not sufficient to nucleate and grow the crystallized phases. As a result, FIG. 3 exhibits a series of weak X-ray reflections corresponding to small volumes of crystallized phases containing the Sr V and O chemical components.

Figure 4A:
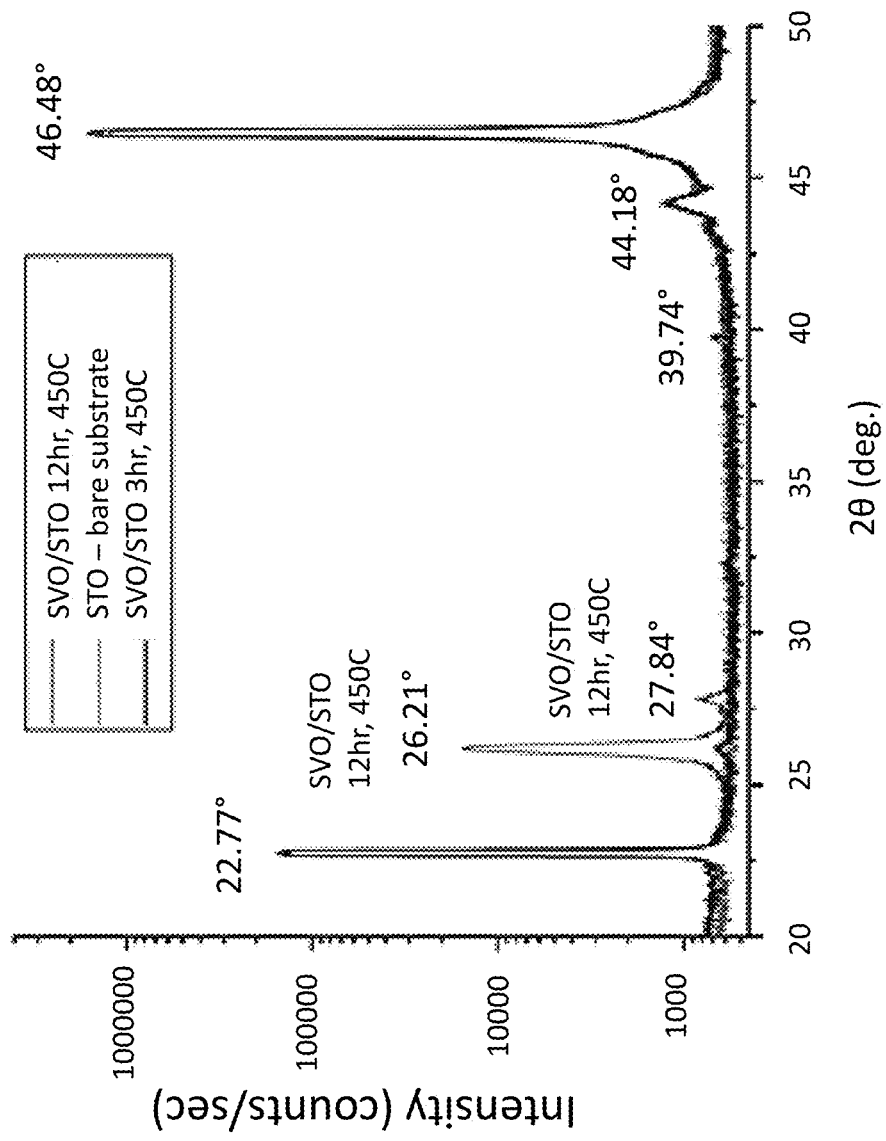
FIG. 4A. XRD pattern of a sample created by depositing an amorphous layer from the SVO substrate onto an 001 $SrTiO_3$ (STO) substrate and heating to 450° C. for periods of 3 h and 12 h.
Figure 4B:
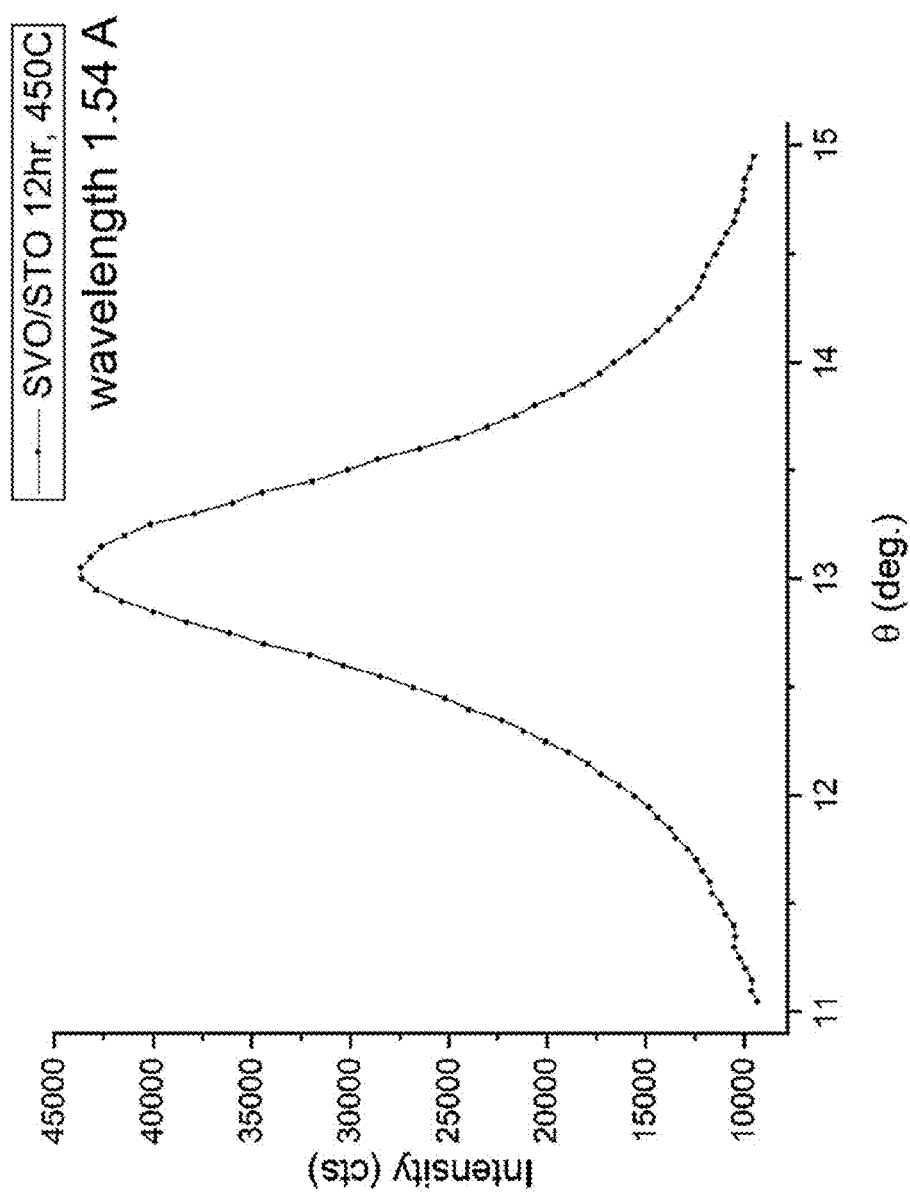
FIG. 4B. Diffraction peak having an angular crystallographic mosaic full-width-at-half-maximum (FWHM) of approximately 1°.

One approach to the creation of SVO is via the solid-state reduction of a crystallized layer in which the Sr:V ratio is 1:1 but with an incorrect oxidation state of V. The XRD pattern of a sample created by depositing an amorphous layer from the SVO target onto an 001 STO substrate and heating to 450° C. for 12 h is shown in FIG. 4A. The XRD pattern at 12 h exhibits X-ray reflections from a phase containing Sr, V, and O. The diffraction peak has an angular crystallographic mosaic FWHM of approximately 1° (FIG. 4B), indicating that it has a high degree of angular orientation. The desired SVO phase would produce reflections at approximately 23.2°, 33.0°, 40.7°, and 47.3° in FIG. 4A but these reflections are absent from the XRD patterns. The crystallized phase formed by heating at low temperatures in air on an STO 001 substrate can be converted to SVO by a reduction step. A suitable reduction step has been described in the literature for Sr-V-O compounds formed by more conventional thin-film growth techniques, for example by Bérini et al. Adv. Mater. Interf. 3, 1600274 (2016).

Figure 5A:
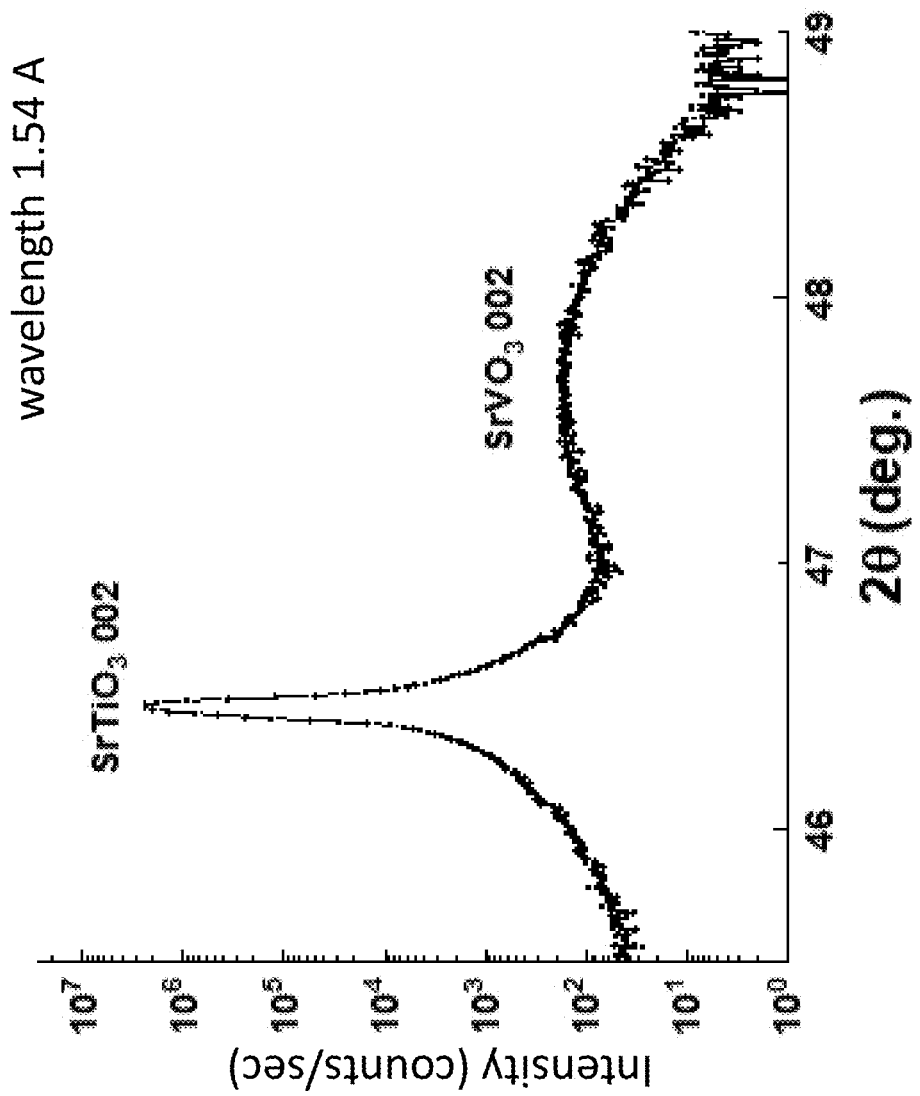
FIG. 5A. XRD pattern of a sample created by depositing an amorphous layer from the SVO substrate onto an 001 STO substrate and heating to 750° C. for 3 h in a 5% $H_2$ in Ar gas atmosphere.
Figure 5B:
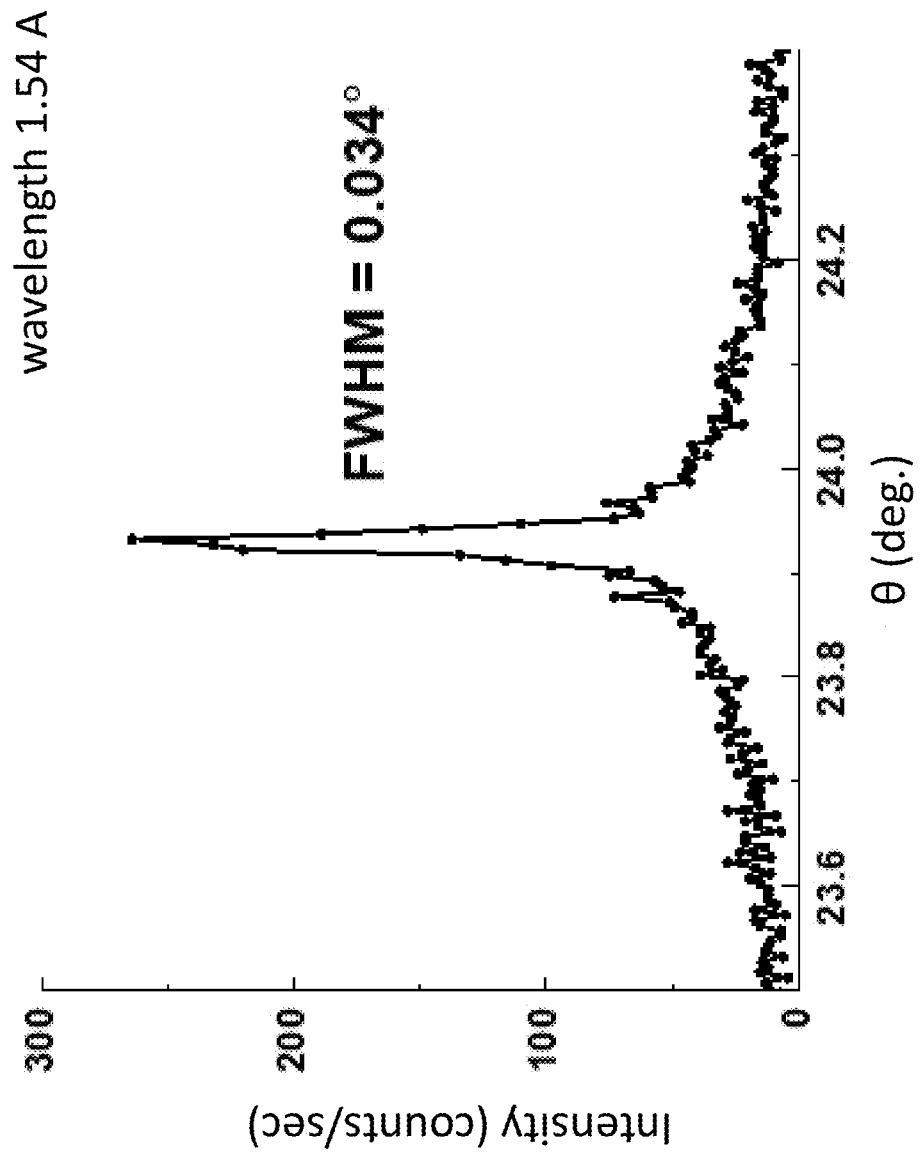
FIG. 5B. XRD rocking curve with an angular FWHM of 0.034°.

A second approach involves direct crystallization into the SVO phase. FIG. 5A shows the XRD pattern of a sample created by depositing an amorphous layer from the SVO target onto an 001 STO substrate and heating to 750° C. for 3 h in a 5% $H_2$ in Ar gas atmosphere. The 5% $H_2$ in Ar gas atmosphere ambient is an example of an atmosphere that can reduce the oxidation state of the vanadium ions. The SVO phase is characterized by an X-ray reflection at 47.7°, corresponding to 002 planes. The diffraction peak corresponding to the 002 interplanar spacing of the epitaxial SVO layer has a crystallographic mosaic FWHM of 0.034° (FIG. 5B).

The difference between the crystallization of the amorphous layers under these conditions indicates that the crystalline STO substrate provides a structural template inducing the nucleation of the crystalline phase and allowing the rapid crystallization of the amorphous Sr, V, O compounds into ordered crystals. The $SiO_2$/Si substrate does not provide a template and, thus, exhibits crystallization requiring longer times at low temperatures of 450° C. or leads to reactions and to the formation of misoriented crystalline phases.

Example 2

This example illustrates strategies for forming crystalline seeds and carrying out seeded crystal nucleation within an amorphous perovskite oxide layer, and for characterizing the resulting crystalline film, using STO as an illustrative example. This example further describes the kinetic phenomena important to crystallization, including the relatively large importance of specific processes occurring within the amorphous perovskite oxide. STO serves as a model system for the phenomenon of lateral crystallization of perovskite oxides. The formation of SVO faces additional challenges due to the possibility of the oxidation of V to form competing undesired crystalline phases, as discussed above. Lateral crystallization is first demonstrated here using the crystallization of amorphous STO layers.

The nucleation strategies demonstrated here for the STO model system employ two types of seeds: (i) single-crystal SRO NMs with (001) orientation and a thickness of 50 nm and (ii) nanocrystalline seeds of STO with a few nanometers in thickness and with random orientation. The nanoscale seeds were placed on $SiO_2$/Si substrates. The kinetics of crystallization at the temperature investigated here favor crystal growth initiated at seeds rather than at nucleation sites located away from seeds, and as a result, regions with several microns in extent can be crystallized near seeds before nucleation at separate locations.

Figures 6A, 6B:
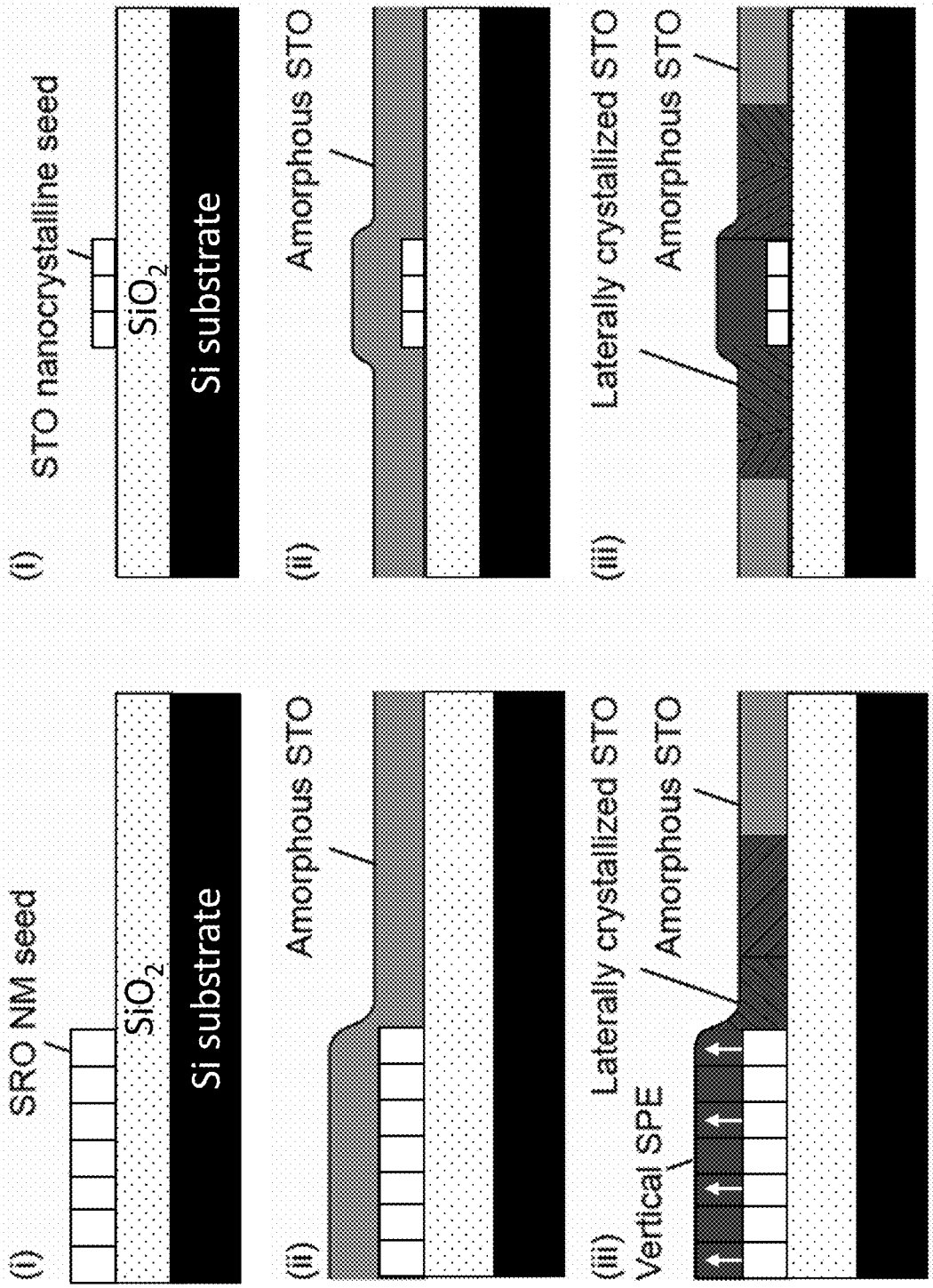
FIGS. 6A and 6B depict seeded solid-phase crystallization of amorphous STO using (FIG. 6A) a single-crystal $SrRuO_3$ (SRO) nanomembrane (NM) seed and (FIG. 6B) a STO nanocrystalline seed. Step (i) shows placement or fabrication of seeds on a Sift/Si substrate; step (ii) shows deposition of an amorphous STO layer; step (iii) shows vertical crystallization of amorphous STO on top of the SRO NM and lateral crystallization of amorphous STO from the edges of the seeds.

The use of nanoscale seeds supported on $SiO_2$/Si substrates to initiate the crystallization of STO is illustrated in step (i) of FIGS. 6A and 6B. The SRO NM and STO nanocrystalline seeds were subsequently covered with a uniform amorphous STO layer deposited by sputter deposition over the entire surface, as depicted in step (ii) of FIGS. 6A and 6B. Heating the seed crystal/amorphous layer structure induces solid-phase crystallization (step (iii) of FIGS. 6A and 6B). At the relatively low temperature employed in this example, amorphous STO crystallizes laterally from the seed crystals over several microns before impinging on crystals formed via unseeded nucleation. A similar strategy is described below for the SVO system.

Amorphous STO films were deposited from an STO sputtering target using a sputtering process identical to the process described in Example 1. The crystallization processes also employed the arrangement described in Example 1.

SEM characterization was performed using a Zeiss LEO 1530 Schottky-type field-emission scanning electron microscope, with an accelerating voltage of 3 kV (FIGS. 7A-7B, FIGS. 8A-8E, FIG. 10, and FIG. 12) or 15 kV (FIGS. 11A-11D). The orientation of STO crystallized near SRO NMs was probed by EBSD using imaging and analysis software (EDAX, Inc.). The EBSD data was acquired with the sample tilted 70° with respect to the primary beam. The surface morphology of the STO seed crystals was imaged using a non-contact mode with a Bruker Multimode 8 AFM.

X-ray scattering characterization of the amorphous STO layers was performed using the X-ray scattering methods reported in Example 1. The incident angle for studies of amorphous STO thin films was 1.4°. Additional laboratory thin-film XRD data were collected using a Panalytical X'Pert MRD with monochromatic Cu $K\alpha_1$ radiation at $\lambda$=1.5406 Å.

Synchrotron nanobeam XRD studies were conducted using the hard X-ray nanoprobe at station 26-ID-C of the Advanced Photon Source at Argonne National Laboratory with the sample in vacuum. The diffracted beam intensity was recorded using a hybrid pixel array detector (LynX 1800 Medipix 3RX) using a horizontal scattering geometry. An X-ray beam with a photon energy of 9 keV ($\lambda$=1.3776 Å) and an X-ray spot size of 50 µm was used for studies of crystallization on SRO NMs. An X-ray beam with photon energy of 10 keV ($\lambda$=1.2398 Å) and focal spot size of 30 nm was used to probe the STO nanocrystalline seeds. The intensity distributions are reported in terms of the wavevector Q, defined as Q=$4\pi/\lambda$ sin $\theta$.

The SRO NM seed crystals were formed by transferring 50-nm-thick single-crystalline SRO NMs to Sift/Si. The SRO NMs were synthesized by a multi-step process beginning with the epitaxial growth of SRO thin films on STO (001) substrates. The SRO layers with dimensions of 2×2 mm² were patterned with a photoresist exhibiting a periodic array of 50×50 µm² holes and then immersed in a room-temperature HF/$HNO_3$/$H_2O$ etching solution allowed to reach the substrate. The duration of the immersion depended on the size and spacing of the etchant access holes. The NMs became freestanding after the near surface region of the STO substrate was dissolved. SRO has excellent chemical and thermal stability and a lattice parameter close to STO, making it a favorable choice for use as a seed crystal that can be moved to other substrates using liquid or dry transfer.

The SRO NMs had lateral dimensions ranging from several micrometers to one millimeter and were transferred to $SiO_2$/Si from the surface of the etching solution by slowly withdrawing a submerged $SiO_2$/Si substrate from the solution. A SEM image of a corner of a SRO NM on a $SiO_2$/Si substrate shows that the SRO NM is uniform and has abrupt edges.

Figures 7A, 7B:
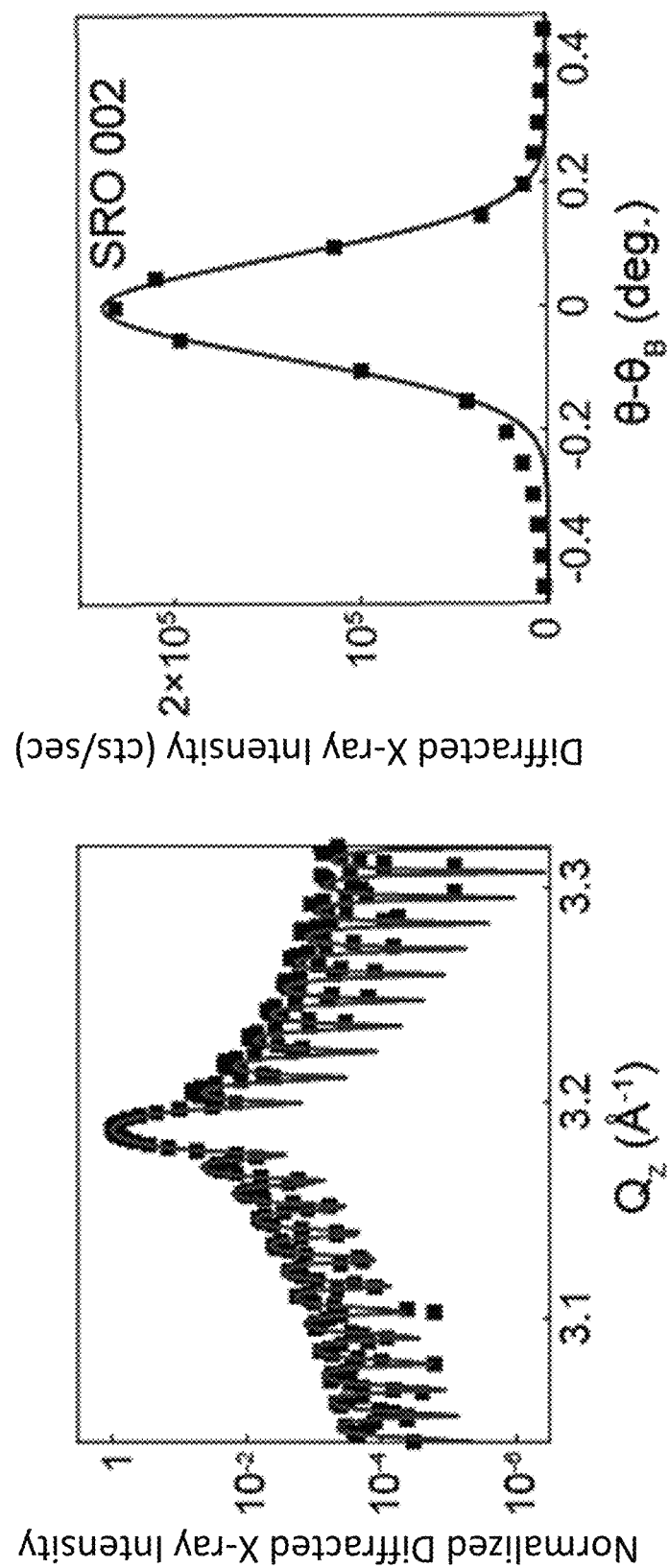
FIG. 7A depicts an XRD pattern of a SRO NM seed.
FIG. 7B depicts an X-ray rocking curve of a SRO NM seed. Here, $\theta_B=20.43°$ is the Bragg angle of the SRO 002 pseudocubic reflection at the 9 keV X-ray photon energy of these measurements.

The SRO NM sheets were characterized using synchrotron XRD with a photon energy of 9 keV and a spot size of 50 µm. FIG. 7A shows a plot of the intensity as a function of the out-of-plane wavevector $Q_z$, equivalent to a thin-film θ-2θ scan, for the SRO 002 X-ray reflection. The out-of-plane lattice parameter and thickness derived from FIG. 7A are 3.94 Å and 52 nm. The FWHM of the rocking curve of the SRO 002 reflection is 0.19° (FIG. 7B), indicating that the SRO NM remains a single crystal after it is transferred.

Figures 8A, 8B:
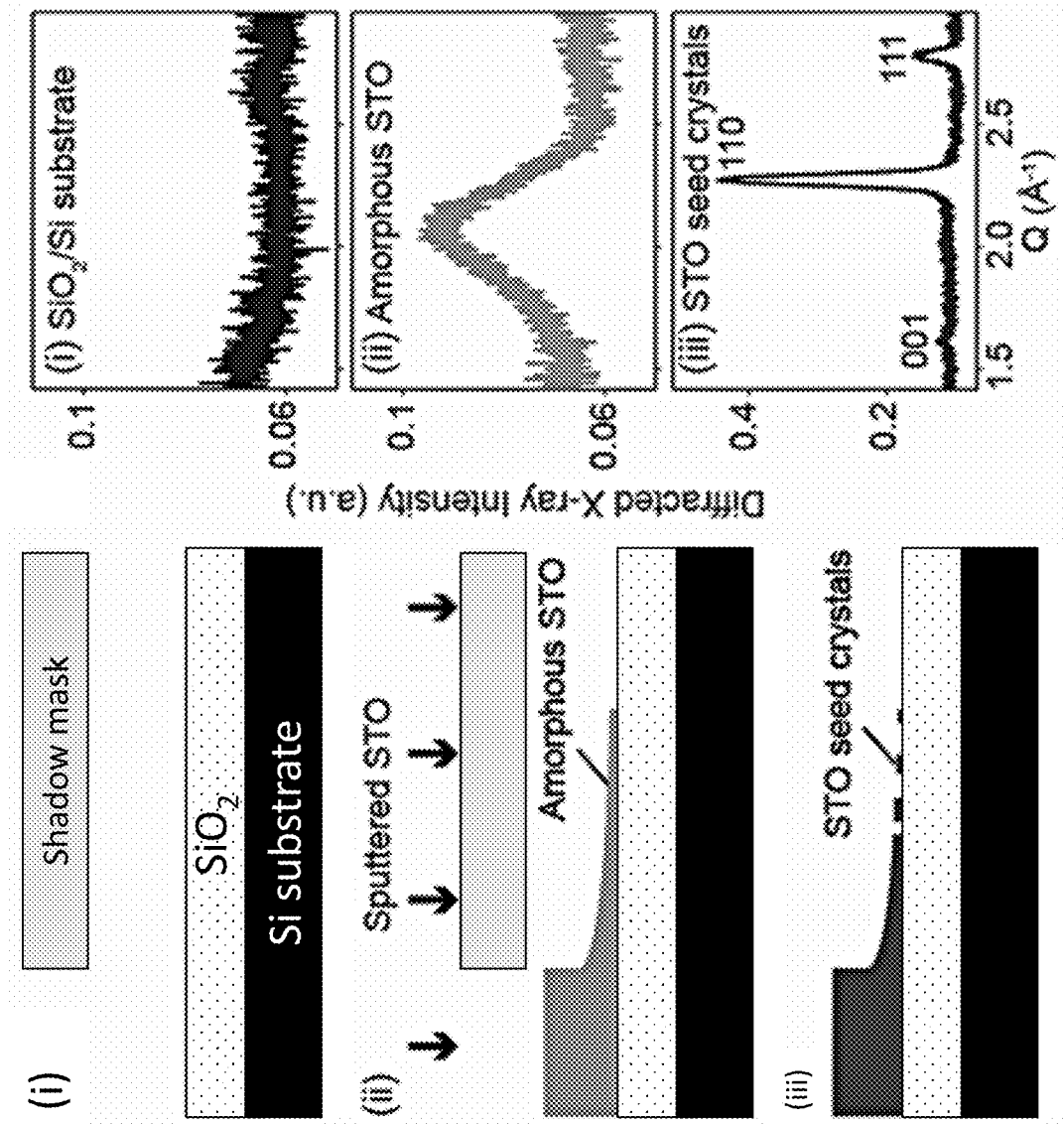
FIG. 8A depicts synthesis of STO seed crystals. Step (i) shows a Sift/Si substrate; step (ii) shows deposition of an amorphous STO layer onto the substrate through a shadow mask, creating a low-coverage of amorphous STO close to the shadow mask edge; step (iii) shows ripening and crystallization of STO seeds.
FIG. 8B depicts grazing-incidence X-ray scattering corresponding to steps (i) to (iii) in the synthesis of STO seed crystals.

The strategy employing STO seed crystals is based on the synthesis of widely dispersed STO nanocrystals. The STO seed crystals were created by depositing a thin amorphous STO layer through a shadow mask, followed by dewetting and crystallization of the layer by thermal annealing. The steps involved in this process are illustrated in FIG. 8A. A very thin STO layer forms adjacent to the thicker layer deposited through the openings of the shadow mask (Fotofab, LLC), as shown in panels (i) and (ii) of FIG. 8A. The amorphous layer was crystallized by heating to 650° C. for 180 min, as shown in panel (iii) of FIG. 8A.

XRD measurements using a laboratory X-ray diffractometer were conducted at each step in the formation of the nanocrystalline STO seeds. FIG. 8B shows grazing-incidence X-ray scattering patterns acquired from the bare $SiO_2$/Si substrate, the as-deposited amorphous STO film, and the fully crystallized STO. The bare $SiO_2$/Si substrate exhibits a featureless low-intensity background. The X-ray scattering pattern of the amorphous STO includes a broad intensity maximum centered at wavevector $Q=2.1$ Å$^{-1}$. After heating to 650° C. for 180 min, the broad peak disappeared and a series of polycrystalline STO X-ray reflections with far higher intensity appeared. The sharp reflections indicate that the amorphous STO had crystallized into polycrystalline STO seeds.

Figures 8C, 8D, 8E:
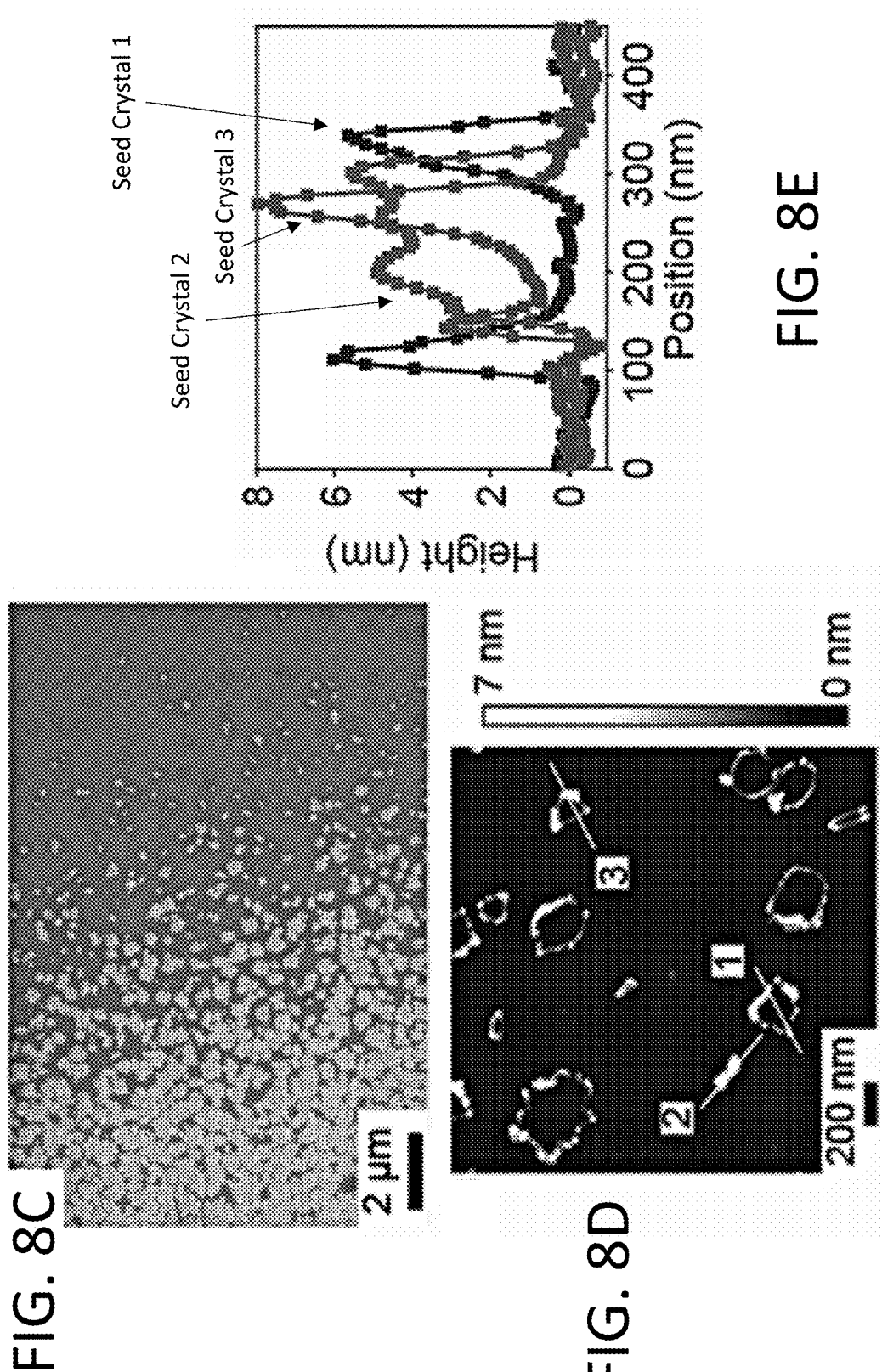
FIG. 8C depicts a scanning electron microscope (SEM) image of the distribution and shapes of STO seed crystals.
FIG. 8D depicts an atomic force microscopy (AFM) image of STO seed crystals.
FIG. 8E depicts height profiles of the crystals indicated in FIG. 8D.

The spatial distribution of the STO seeds is shown in the SEM image in FIG. 8C. A key feature in this distribution is a gradient in the seed concentration resulting from the initial non-uniformity of the STO coverage near the edge of the shadow mask. The seeds have sizes ranging from tens to hundreds of nanometers. Many isolated STO seeds have only three or four lateral facets, which suggests that these particular seeds are composed of just one or a few STO crystals. Larger seeds without obvious facets may be aggregates of several crystals with different orientations.

FIG. 8D shows an AFM topography image of an area containing several isolated STO nanocrystalline seeds. The STO seed crystals have a complex height profile in which their edges are higher than their centers, as shown in FIG. 8E for three different crystallites. In each case, the edges of the seeds are 1-7 nm higher than their centers, consistent with the curvature of the seeds, as discussed below. The inside of the seed crystals is very thin, with apparent heights from 0.1 nm to 5 nm, as shown in the height profiles of several nanocrystalline seeds in FIG. 8E.

The crystallinity and orientation of the STO nanocrystalline seeds were probed using synchrotron nanobeam XRD with a spot size of 30 nm. The nanocrystalline seeds were investigated within a sample composed of both seeds and an STO layer, after heating to 450° C. for 2160 min. The nanodiffraction experiment thus probed the seeds, and the volume of material crystallized above each seed. FIGS. 9A and 9B show maps of the diffracted intensity as a function of the X-ray beam location in regions where STO crystallites are oriented with the [110] and [001] directions aligned along the surface normal, respectively. The crystallites in FIGS. 9A and 9B have lateral sizes of hundreds of nanometers, consistent with the SEM and AFM images in FIGS. 8C and 8D. The spatial extents of the crystals appearing in the nanobeam diffraction maps span a subset of their overall physical volume in which the Bragg condition is satisfied and the detector accepts the diffracted beam. For the (110) STO crystallite map in FIG. 9A, the total detector acceptance was increased by scanning the detector through a series of angular settings to acquire the map. The images of the [110]-oriented crystal thus reflect the full extent of the crystal. The (001)-oriented crystal in FIG. 9B was studied with a smaller X-ray detector acceptance, and the extent of this crystal is slightly underestimated.

Both the AFM and X-ray nanobeam measurements indicate that the STO crystallites have a significant curvature. The X-ray nanobeam diffraction study shows that the orientation of the seeds in FIGS. 9A and 9B vary by 7° over a distance of 200 nm, which is consistent with the tilt of $\tan^{-1}(5\ nm/50\ nm) \approx 6°$ observed in the AFM height profiles in FIG. 8E. The radius of curvature of the seeds is thus approximately 1 µm. A schematic model of the microstructure of the STO nanocrystalline seeds based on these measurements is shown in FIG. 9C. The seeds exhibit both a range of crystallographic orientations and a morphology in which crystal is higher at the edges.

Lateral crystallization was studied by probing crystal growth within an amorphous STO layer of a uniform thickness deposited across the entire surface, including the regions atop and adjacent to the seed crystals, as depicted in step (ii) of FIG. 6B. The uniform amorphous STO precursor layers had thicknesses of approximately 40 nm, which were not perturbed by the presence of the seed crystals during deposition.

Figure 10:
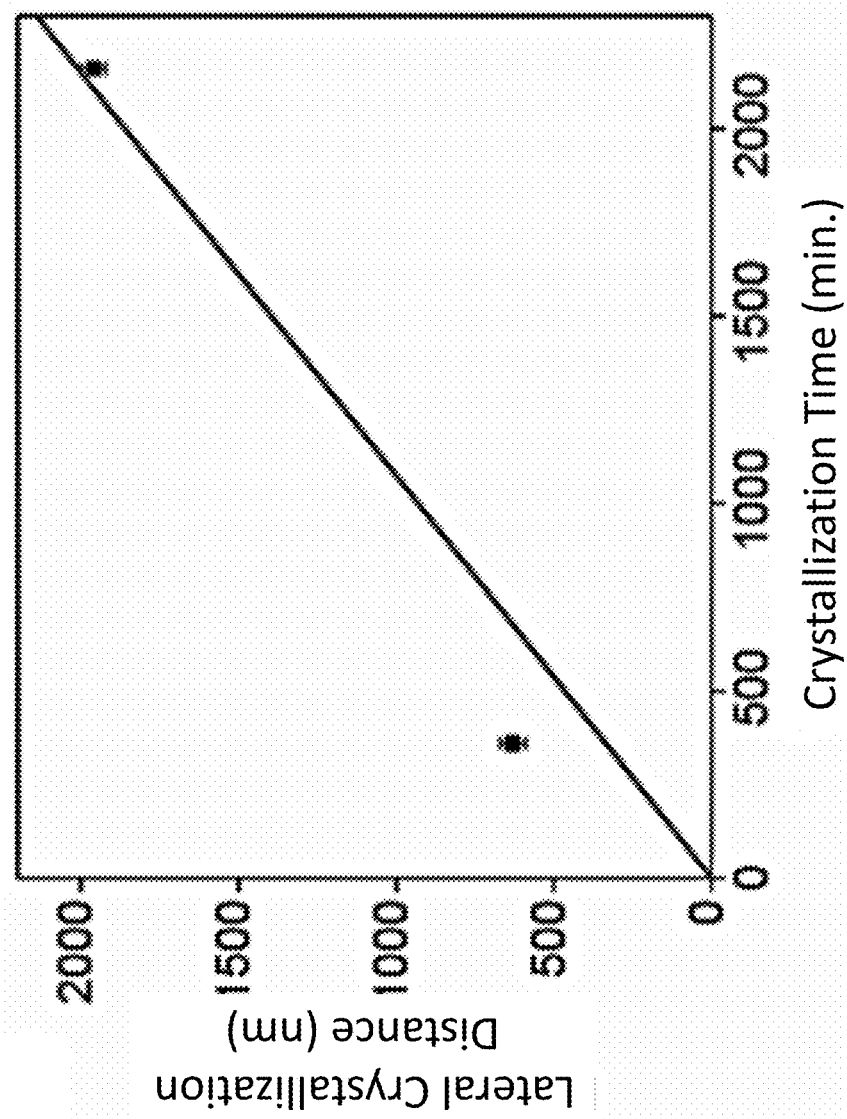
FIG. 10 depicts the lateral crystallization distance from the edge of the SRO NM seed as a function of crystallization time at 450° C. The linear fit gives a lateral crystal growth rate of 0.9 nm/min.

The crystallization of amorphous STO from SRO NM seeds was investigated in a series of experiments in which the samples were heated to 450° C. Crystallization proceeds both laterally from the edges of the SRO NMs and vertically from their faces. Lateral crystal growth results in regions of crystallized STO around the edges of the NMs. SEM images of the edge of a SRO NM with an as-deposited amorphous STO layer and after crystallization by heating to 450° C. for 360 min and 2160 min were obtained. The crystallization process leads to the formation of the comparatively bright regions at the edges of the SRO NM seeds. The lateral growth distances measured at different locations along the edge are 630±40 nm at 360 min and 2000±40 nm at 2160 min. A linear fit to the crystallization distance, shown in FIG. 10, gives a lateral growth rate of 0.9±0.1 nm/min.

The crystallinity and crystallographic orientation of the laterally crystallized STO layer near the SRO NM seed was characterized using EBSD. FIG. 11A shows a secondary electron SEM image of an area close to an edge of the SRO NM seed in which the sample had been heated to 450° C. for 2160 min. FIGS. 11B-11D show EBSD inverse pole figure maps in which each pixel is shaded according to the crystallographic direction within the STO (or STO/SRO) crystal that points along different Cartesian directions. Here, z is parallel to the surface normal, y points away from the edge of the NM, and x is along the edge. The randomly shaded region outside the crystallized region in FIGS. 11B-11D is a result of arbitrary fitting of the background and noise to the EBSD pattern of the amorphous STO layer.

The EBSD inverse pole figure maps of the crystallized regions near the SRO NM show that the laterally crystallized STO has an overall polycrystalline microstructure. Micron-scale STO grains extend from the edge of the SRO NM seed to the crystalline/amorphous STO boundary. A large number of grains within the crystallized STO layer in FIG. 11C are oriented with an <001> direction along the length of the SRO NM edge, the same in-plane orientation as the SRO NM seed. The existence of regions of STO exhibiting the same in-plane orientation as the SRO NM indicates that there is some texture of the laterally crystallized STO within the larger-scale polycrystallinity.

The shape of the crystallized region near the SRO seed provides insight into the dependence of the crystallization rate on the STO crystallographic orientation. FIGS. 11A-11D show that many regions of the crystallized STO near the SRO seed exhibit in-plane growth directions that are not oriented along <001>. The width varies by less than 10% at different locations along the edge and does not show any systematic relationship between growth rate and orientation. The images in FIGS. 11A-11D thus indicate that the growth rates vary by less than 0.1 nm/min as a function of crystallographic orientation under these crystallization conditions.

In addition to the crystallization nucleated at the boundary of the SRO NM, the SEM and EBSD measurements reveal a low concentration of STO crystals that were nucleated in locations away from the edge of the SRO NM seed. A separately crystallized region is visible at a distance of 3 μm from the edge of the SRO NM in the SEM image and EBSD inverse pole figure maps in FIGS. 11B-11D. The EBSD inverse pole figure maps of the crystal nucleated far from the SRO NM does not exhibit the preferred <001> in-plane texture observed in crystals nucleated from the SRO NM. The separately nucleated and crystallized area instead appears to be formed from several crystals with non-<001> directions in the plane of the sample surface.

The lateral crystallization from STO seed crystals was studied by heating the amorphous STO/STO seed structure to 450° C. After heating, circular regions of crystallized STO surrounded each seed crystal, as shown in the SEM images acquired after heating to 450° C. for 270 min, 450 min, and 840 min. The average crystallized radius at different crystallization times was determined by measuring the mean radius of 10-30 isolated crystallized regions at each temperature and is plotted in FIG. 12. The vertical growth of STO on top of the STO seeds through the 40 nm thickness of the amorphous STO takes place over a much shorter time than the micron-scale lateral crystallization. The time associated with the complicated initial three-dimensional crystallization is thus safely neglected in this analysis.

Figure 12:
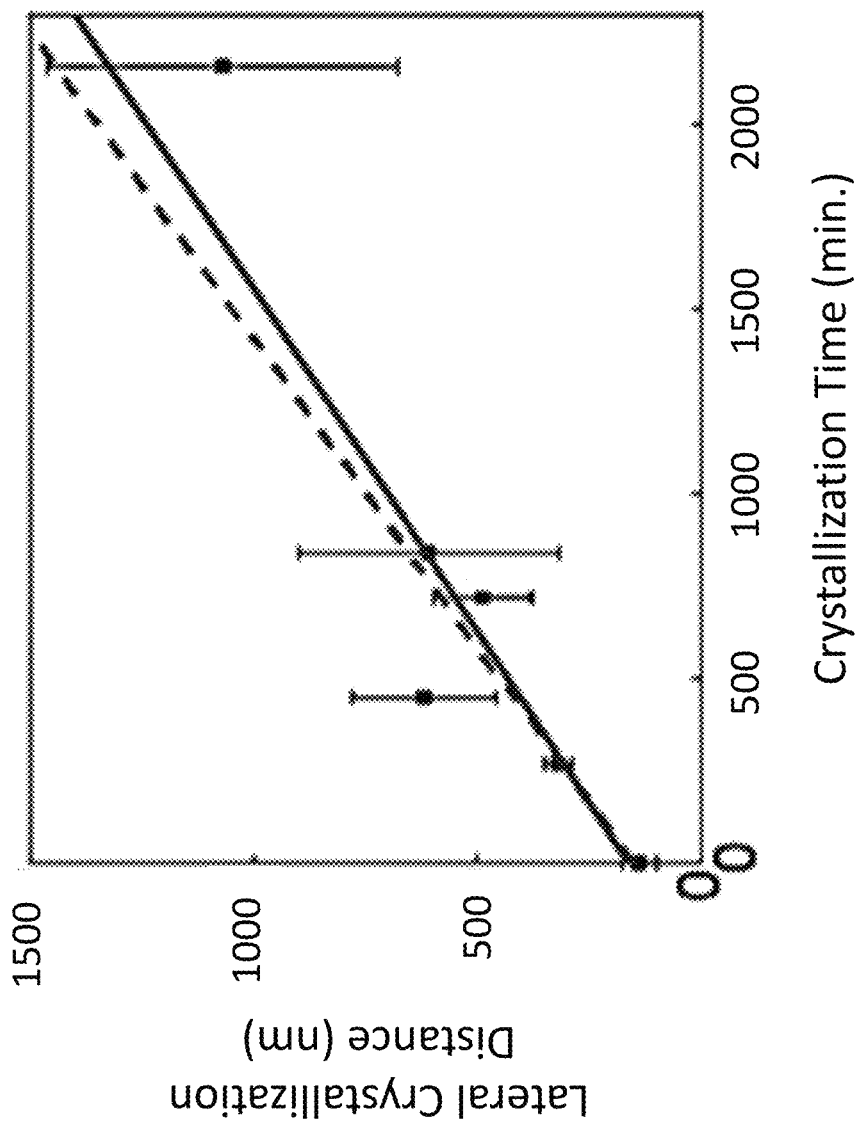
FIG. 12 depicts crystallized radius from STO nanocrystal seeds as a function of crystallization time. The solid and dashed lines are linear fits over the full range of times and times up to 720 min, respectively.

A linear fit to the time-dependence of the crystallization distances observed over the entire range of crystallization times gives a lateral growth rate of 0.5±0.1 nm/min at 450° C., shown as the solid line in FIG. 12. Including only the time points up to 720 min, however, gives a growth rate of 0.6±0.2 nm/min, shown as the dashed line in FIG. 12.

The crystals formed by heating to 450° C. for 270 min are approximately circular and have a mean radius of 300 nm. The statistical distribution of radii has a standard deviation of 30 nm. Crystallization into circular islands indicates that, under these conditions, the growth rate does not depend on the crystallographic orientation of the amorphous/crystalline interface. The effectively isotropic rate of crystallization from nanocrystalline STO seeds matches what was observed during crystallization from the SRO NM seeds.

Nucleation and growth of STO crystals at locations away from the STO nanocrystalline seeds were observed at long crystallization times. The contrast in the SEM images of the STO film with the nanocrystalline seeds heated to 450° C. for 840 min allows the crystallized STO to be distinguished from the STO nanocrystalline seed. The crystallized STO regions nucleated at seed crystals have a mean radius of 800 nm. Other crystallized regions have smaller radii ranging from 200 to 400 nm. This range of sizes is far larger than the small standard deviation observed with shorter heating times. The absence of visible STO seed crystals at the centers of the regions with smaller radii indicates that they were formed by nucleation at sites away from the seeds following a long incubation time. Including the crystalline areas nucleated in regions away from the nanocrystalline seeds causes a slight underestimation in the determination of the lateral crystallization velocity. The growth rate from the SRO NM seeds was not systematically underestimated because the nucleation and growth of STO crystals away from the edge of SRO NM did not affect the measurement of the crystallization distance in that system.

Figure 13:
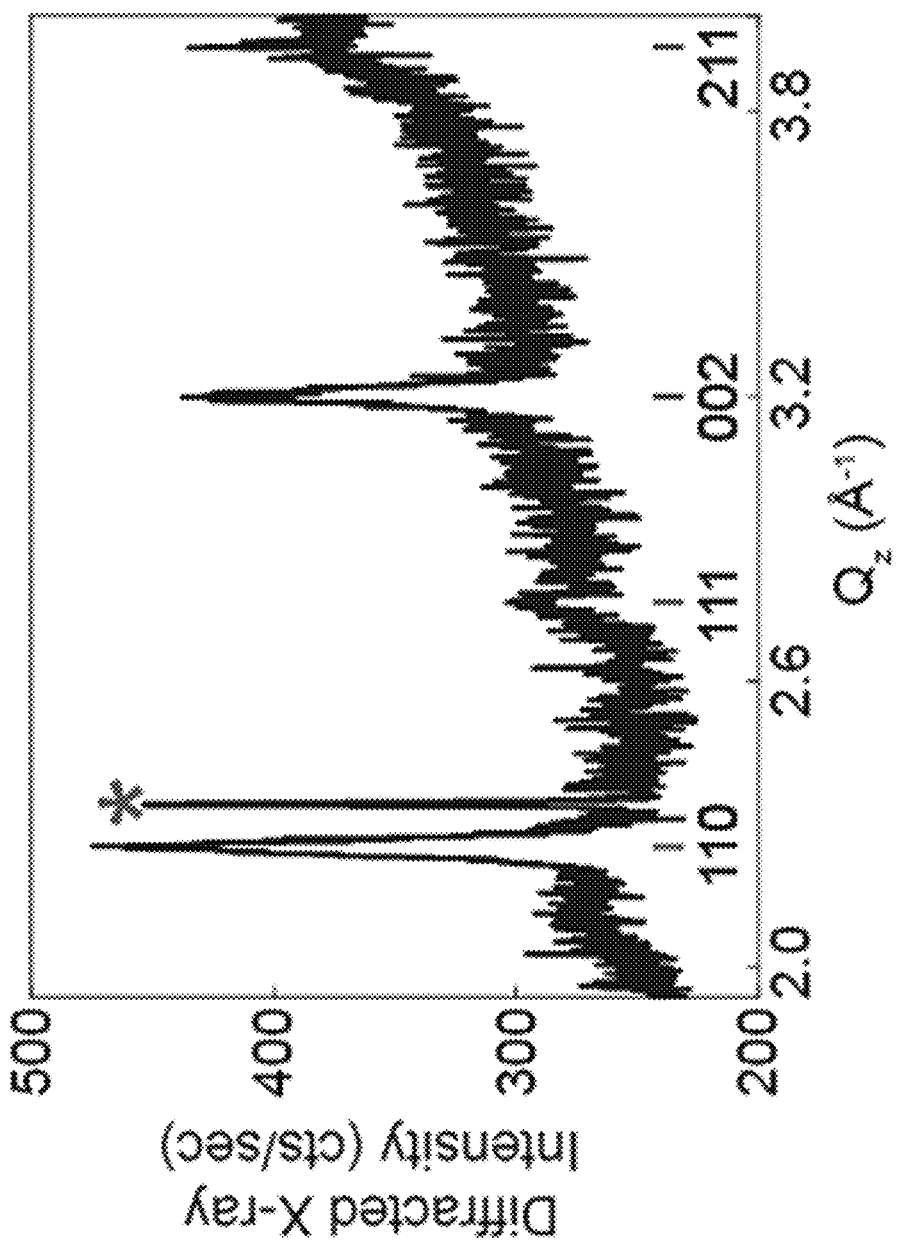
FIG. 13 depicts an XRD pattern of STO crystallized at 450° C. for 2160 min with STO seed crystals. Reflections arising from STO are labeled with their indices. An additional reflection at $Q_z=2.34$ Å$^{-1}$ (marked with *) arises from the diffraction of incident X-rays with one half of the nominal incident wavelength by the Si substrate 004 reflection.

The microstructure of STO crystallized at 450° C. for 2160 min using the nanocrystalline STO seeds was evaluated using an unfocused synchrotron X-ray beam with a spot size of 100×100 μm². FIG. 13 shows a radial scan in reciprocal space, acquired as a θ-2θ scan, in which the X-ray beam probed a region near the edge of a shadow mask. The peak positions and relative integrated peak intensities agree with the powder XRD pattern of STO, consistent with the formation of polycrystalline STO in random orientations.

Figure 14B:
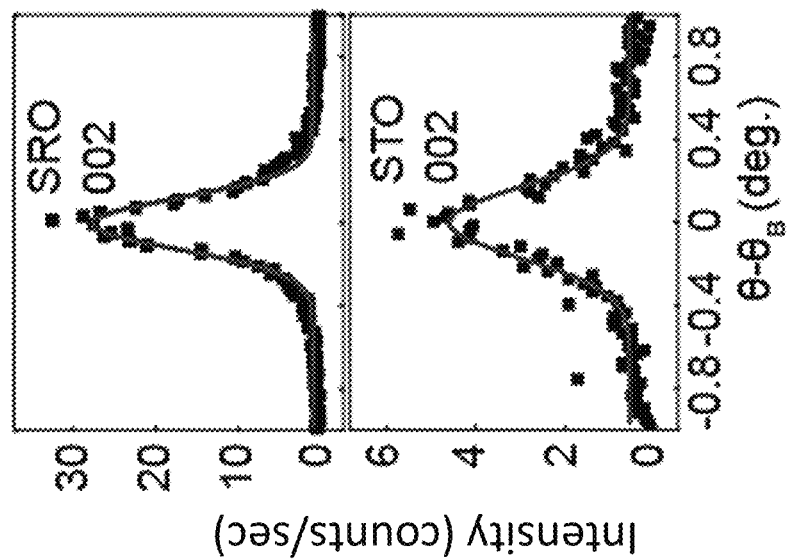
FIG. 14B depicts rocking curve scans of SRO 002 and STO 002 reflections with Gaussian fits used to find the angular widths of each reflection.
Figure 14A:
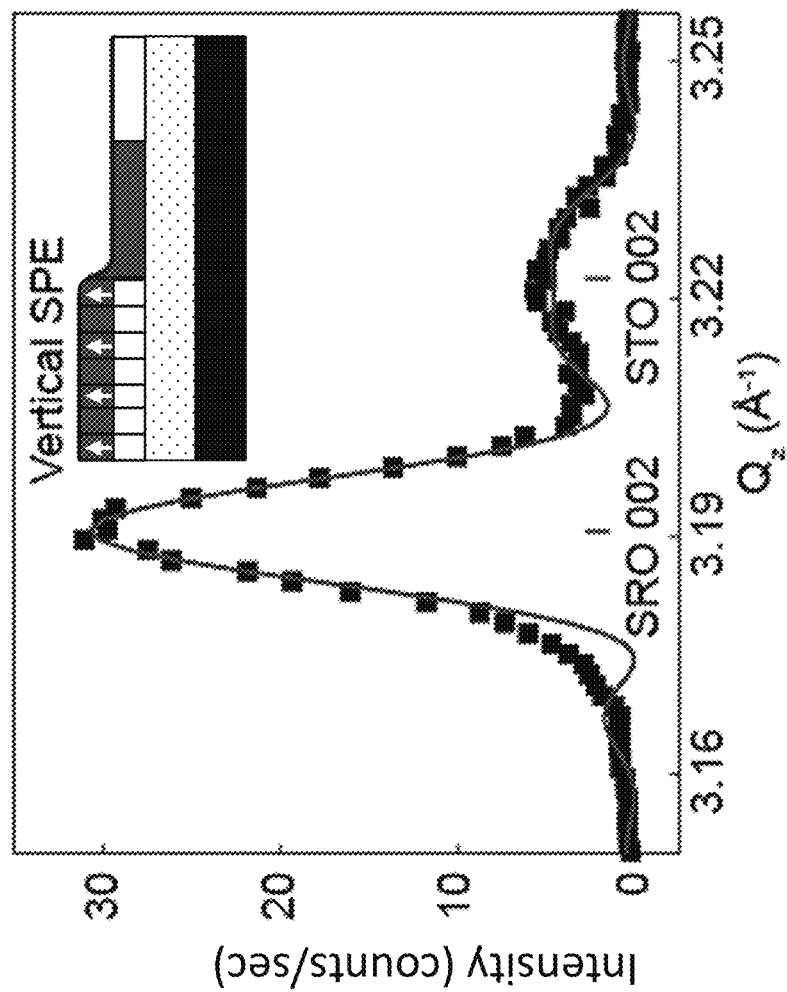
FIG. 14A depicts an XRD pattern (points) and a kinematic XRD simulation (line) of STO crystallized on SRO NM seeds at 450° C. for 2160 min.

The structure of STO crystallized on top of the SRO NM was examined by synchrotron and laboratory-source XRD. The laboratory-source diffraction study employed a millimeter-scale X-ray beam and thus provided a diffraction pattern averaged over the full area of the sample. The laterally crystallized regions near the edges of the NMs occupied a small fraction of the total sample area covered by the SRO NMs and thus contributed negligibly to the area-averaged diffracted intensity. FIG. 14A shows the intensity as a function of $Q_z$ for STO crystallized on SRO NM seeds by annealing at 450° C. for 2160 min. Both the SRO 002 and STO 002 reflections are evident, showing that the amorphous STO film on top of the SRO NM transforms into an epitaxial layer. The out-of-plane lattice parameter and thickness of the SRO NM derived from FIG. 14A are 3.94 Å and 38 nm, respectively. The SRO NM also had a lattice parameter of 3.94 Å before the deposition of STO and the crystallization process, indicating that the SRO NM remains relaxed on SiO₂/Si substrates after deposition of an amorphous STO layer and the subsequent annealing procedure. The crystallized STO layer has an out-of-plane lattice parameter of 3.902 Å and a thickness of 28 nm. The crystallized STO layer thus has a compressive strain $\varepsilon_{out}$=−0.1% with respect to the bulk STO lattice parameter 3.905 Å. The expected value of $\varepsilon_{out}$ arising from the mechanical constraint imparted by the SRO NM on the STO is:

$$\varepsilon_{out} = -\frac{2v}{1-v}\varepsilon_{in}.$$

Here, $\varepsilon_{in}$ is the in-plane strain and v=0.232 is the STO Poisson ratio. A fully coherent epitaxial layer of STO on the SRO NM would have in-plane strain $\varepsilon_{in}$=0.9% and out-of-plane strain $\varepsilon_{out}$=−0.5%. The observed strain of −0.1% indicates that the crystallized STO film on SRO NM is nearly completely relaxed under these deposition and crystallization conditions. A separate X-ray study probed the in-plane lattice parameters of STO and SRO by measuring the angles between their 002 and 103 X-ray reflections. The difference between the STO and SRO interplanar angles was consistent with partial relaxation of the epitaxial STO layer.

The angular widths of the X-ray rocking curves provide insight into the relative defect densities of these layers. FIG. 14B shows rocking curve scans of SRO 002 and STO 002 reflections near the Bragg angle $\theta_B$, which give FWHM values of 0.29° and 0.40°, respectively. The crystallized STO on top of the SRO membrane thus has extended defects leading to a broader mosaic width than the SRO membrane.

Figures 14C, 14D:
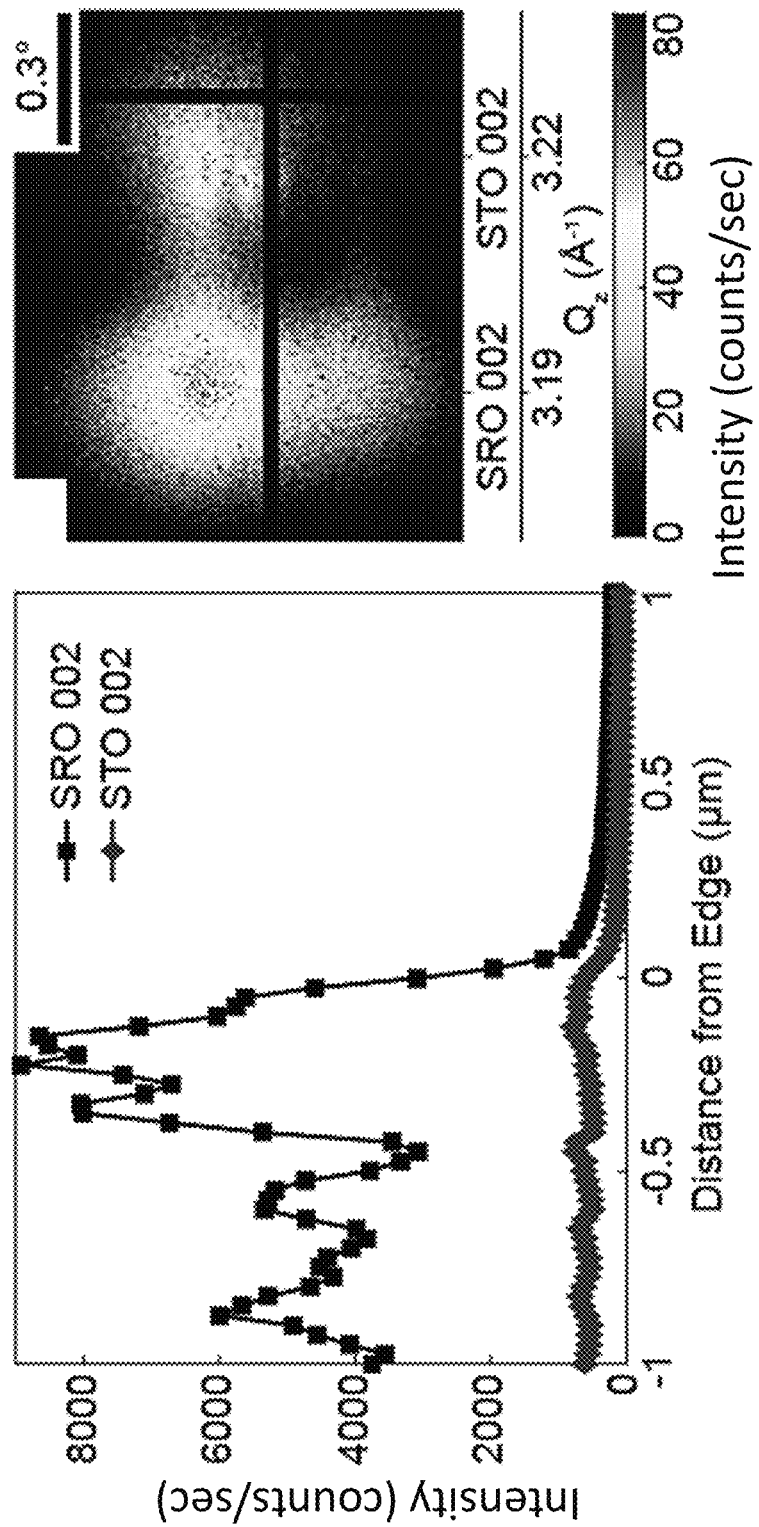
FIG. 14C depicts intensities of SRO 002 and STO 002 reflections as a function of position along a line crossing the edge of the SRO NM, measured with synchrotron nanobeam XRD.
FIG. 14D depicts an individual XRD pattern with STO 002 and SRO 002 reflections acquired with the X-ray nanobeam illuminating the SRO seed and epitaxial STO layer. The horizontal angular axis of the diffraction plane is in the scattering plane and is labeled with corresponding values of the wavevector $Q_z$. The vertical axis is the out-of-plane scattering angle. Dark lines arise from the insensitive area between quadrants of the X-ray detector.

The local epitaxial relationship between SRO and STO was probed with synchrotron nanobeam XRD. The relatively large convergence angle of the nanofocused beam allowed a single incident angle to be used to probe both the STO 002 and SRO 002 reflections simultaneously. FIG. 14C plots the intensity of each reflection as a function of position along a line crossing the edge of the SRO NM. The simultaneous rapid decrease of the diffracted intensity from STO and SRO at the edge of the SRO NM indicates that the STO grows epitaxially on the SRO NM. The abrupt decrease in the STO 002 intensity away from the edge of the SRO NM also shows that the laterally crystallized STO does not have an [001] out-of-plane orientation. A diffraction pattern acquired with the X-ray nanobeam illuminating only the SRO seed and the top epitaxial STO layer is shown in FIG. 14D. The narrow angular range of STO 002 reflection along the vertical direction of the 2D detector further indicates that the STO film is epitaxially grown on the SRO NM.

Figure 15:
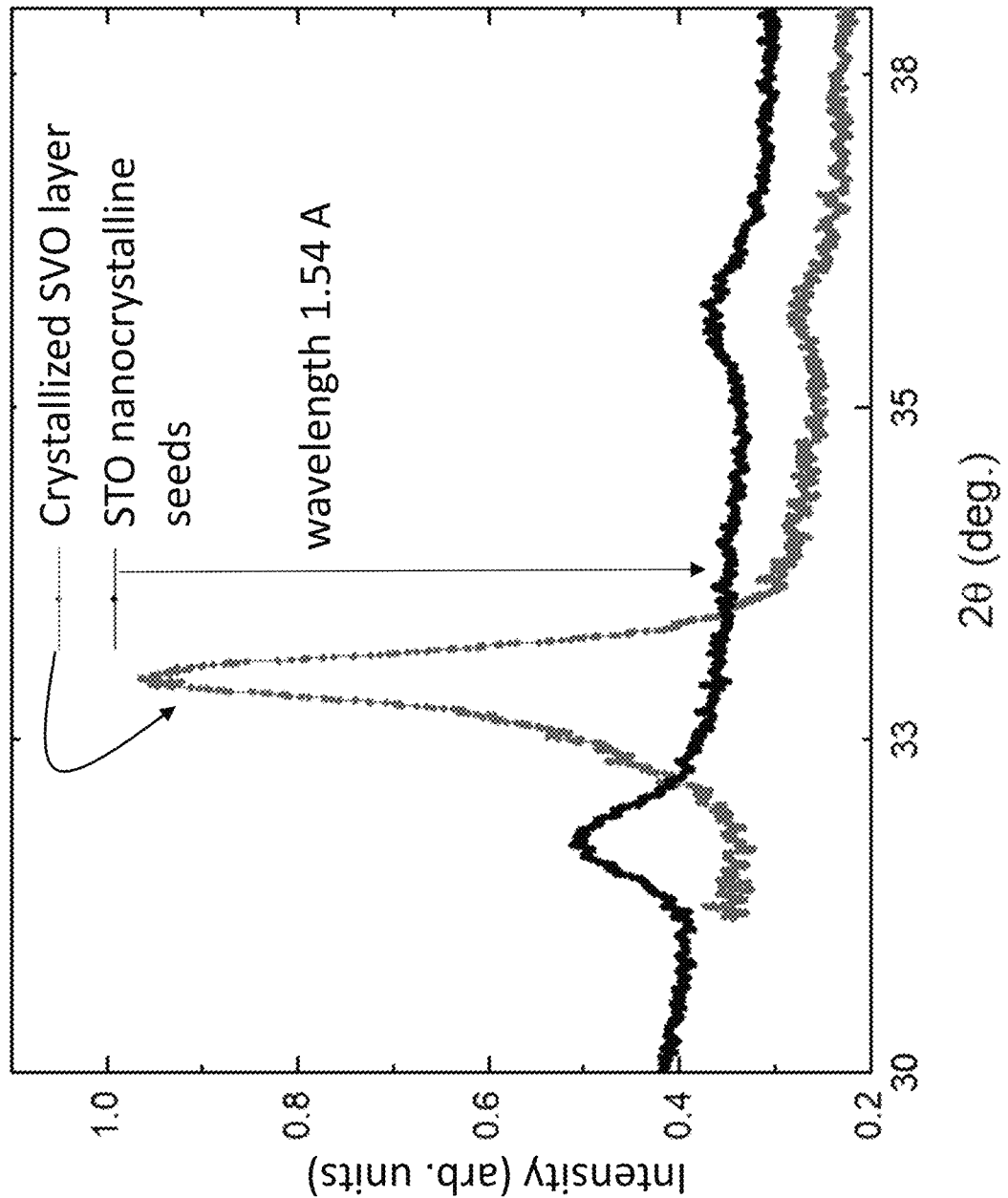
FIG. 15 depicts the XRD patterns of a sample with STO nanocrystalline seeds and of a layer formed by depositing an amorphous layer from an SVO target and heating at 500° C. for 2 h in a gas ambient consisting of 5% $H_2$ in Ar at atmospheric pressure.

The crystallization of SVO using STO nanocrystalline seeds is illustrated in FIG. 15. FIG. 15 shows XRD patterns acquired from an SiO$_2$/Si sample on which STO nanocrystalline seeds have been formed using the procedure described above. The STO nanocrystalline seed XRD pattern exhibits STO 110 and 111 reflections indicating that the seeds collectively have a polycrystalline range of crystallographic orientations. An amorphous layer was deposited onto the STO nanocrystalline seeds. The XRD pattern obtained after heating to 650° C. in an H$_2$:Ar gas mixture at 1 atm pressure is also shown in FIG. 15. The reflection near 33° arises from the desired SVO phase.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of forming a polycrystalline vanadate perovskite film, the method comprising:
    forming a plurality of nanoscale crystalline perovskite oxide seeds on a substrate;
    depositing a layer of amorphous vanadate perovskite precursor over the nanoscale crystalline perovskite oxide seeds; and
    heating the layer of amorphous vanadate perovskite precursor, whereby the layer of amorphous vanadate perovskite precursor is laterally crystallized from the nanoscale crystalline perovskite oxide seeds to form the polycrystalline vanadate perovskite film.

2. The method of claim 1, wherein the polycrystalline vanadate perovskite film comprises SrVO$_3$, CaVO$_3$, La$_x$Sr$_{1-x}$VO$_3$, where x is in the range from 0 to 0.5, or a mixture of two or more thereof.

3. The method of claim 1, wherein the polycrystalline vanadate perovskite film is an SrVO$_3$ film.

4. The method of claim 1, wherein the polycrystalline vanadate perovskite film is a CaVO$_3$ film.

5. The method of claim 1, wherein the polycrystalline vanadate perovskite film is an La$_x$Sr$_{1-x}$VO$_3$ film, where x is in the range from 0 to 0.5.

6. The method of claim 1, wherein heating the layer of amorphous vanadate perovskite precursor comprises heating the layer of amorphous vanadate perovskite precursor to a temperature lower than 500° C., and further wherein the polycrystalline vanadate perovskite film comprises crystal grains having lateral dimensions of at least 1 μm.

7. The method of claim 6, wherein the temperature is lower than 450° C. and the polycrystalline vanadate perovskite film comprises crystal grains having lateral dimensions of at least 2 μm.

8. The method of claim 1, wherein the polycrystalline vanadate perovskite film is formed in an oxygen-containing environment and the vanadium in the as-crystallized polycrystalline vanadate perovskite film has an initial oxidation state, and further wherein the method further comprises reducing the oxidation state of the vanadium in the as-crystallized polycrystalline vanadate perovskite film to a final oxidation state.

9. The method of claim 1, wherein the polycrystalline vanadate perovskite film is formed in a non-oxidizing environment and the vanadium in the as-crystallized polycrystalline perovskite film is formed in a final oxidation state.

10. A method of forming a polycrystalline perovskite oxide film, the method comprising:
    forming a layer of amorphous perovskite oxide precursor on a substrate;
    subsequently embedding one or more nanoscale crystalline perovskite oxide seeds into a surface of the layer of amorphous perovskite oxide precursor; and
    heating the layer of amorphous perovskite oxide precursor to a temperature that favors lateral perovskite oxide crystal growth at the one or more nanoscale crystalline perovskite oxide seeds over homogeneous perovskite oxide crystal nucleation within the layer of amorphous perovskite oxide precursor, whereby the layer of amorphous perovskite oxide precursor is laterally crystallized from the one or more nanoscale crystalline perovskite oxide seeds to form the polycrystalline perovskite oxide film.

11. The method of claim 10, wherein the polycrystalline vanadate perovskite film is formed in an oxygen-containing environment and the vanadium in the as-crystallized polycrystalline vanadate perovskite film has an initial oxidation state, and further wherein the method further comprises reducing the oxidation state of the vanadium in the polycrystalline vanadate perovskite film to a final oxidation state.

12. The method of claim 10, wherein the polycrystalline vanadate perovskite film is formed in a non-oxidizing environment and the vanadium in the as-crystallized polycrystalline perovskite film is formed in a final oxidation state.

13. The method of claim 10, wherein the one or more nanoscale crystalline perovskite oxide seeds have beveled edges at their distal ends, and further wherein embedding the one or more nanoscale crystalline perovskite oxide seeds into the surface of the layer of amorphous perovskite oxide precursor comprises mechanically pressing the one or more nanoscale crystalline perovskite oxide seeds into the layer of amorphous perovskite oxide precursor.

* * * * *

UNITED STATES PATENT AND TRADEMARK OFFICE
CERTIFICATE OF CORRECTION

PATENT NO. : 12,074,235 B2
APPLICATION NO. : 17/015428
DATED : August 27, 2024
INVENTOR(S) : Thomas Francis Kuech et al.

It is certified that error appears in the above-identified patent and that said Letters Patent is hereby corrected as shown below:

In the Specification

Column 2, Line 53:
Delete the phrase "Sift/Si" and replace with --$SiO_2/Si$--.

Column 2, Line 64:
Delete the phrase "Sift/Si" and replace with --$SiO_2/Si$--.

Column 4, Line 61:
Delete the phrase "Hz" and replace with --$H_2$--.

Column 5, Line 48:
Delete the phrase "Sift/Si" and replace with --$SiO_2/Si$--.

Column 10, Line 56:
Delete the phrase "Sift/Si" and replace with --$SiO_2/Si$--.

Signed and Sealed this
Twenty-ninth Day of October, 2024

Katherine Kelly Vidal
*Director of the United States Patent and Trademark Office*